United States Patent
Hirano et al.

(10) Patent No.: US 10,361,346 B2
(45) Date of Patent: Jul. 23, 2019

(54) NITRIDE SEMICONDUCTOR ULTRAVIOLET LIGHT EMITTING DEVICE AND METHOD FOR MANUFACTURING SAME

(71) Applicants: Soko Kagaku Co., Ltd., Ishikawa (JP); AGC INC., Tokyo (JP)

(72) Inventors: Akira Hirano, Aichi (JP); Ko Aosaki, Tokyo (JP)

(73) Assignees: SOKO KAGAKU CO., LTD., Ishikawa (JP); AGC INC., Tokyo (JP)

( * ) Notice: Subject to any disclaimer, the term of this patent is extended or adjusted under 35 U.S.C. 154(b) by 0 days.

(21) Appl. No.: 15/757,203

(22) PCT Filed: Oct. 27, 2015

(86) PCT No.: PCT/JP2015/080256
§ 371 (c)(1),
(2) Date: Mar. 2, 2018

(87) PCT Pub. No.: WO2017/072859
PCT Pub. Date: May 4, 2017

(65) Prior Publication Data
US 2018/0277723 A1 Sep. 27, 2018

(51) Int. Cl.
*H01L 31/0312* (2006.01)
*H01L 33/56* (2010.01)
(Continued)

(52) U.S. Cl.
CPC ........... *H01L 33/56* (2013.01); *H01L 33/007* (2013.01); *H01L 33/06* (2013.01); *H01L 33/20* (2013.01);
(Continued)

(58) Field of Classification Search
CPC ....... H01L 33/007; H01L 33/06; H01L 33/20; H01L 33/22; H01L 33/32
See application file for complete search history.

(56) References Cited

U.S. PATENT DOCUMENTS

2006/0138443 A1  6/2006  Fan et al.
2007/0267645 A1  11/2007  Nakata et al.
(Continued)

FOREIGN PATENT DOCUMENTS

JP  2006278751 A  10/2006
JP  2006348088 A  12/2006
(Continued)

OTHER PUBLICATIONS

Nagamatsu, et al., "High-Efficiency AlGaN-based UV light-emitting diode on laterally overgrown AlN," Journal of Crystal Growth 31, Apr. 2008, 4 pages.
(Continued)

*Primary Examiner* — Samuel A Gebremariam
(74) *Attorney, Agent, or Firm* — Haynes Beffel & Wolfeld LLP

(57) ABSTRACT

A nitride semiconductor ultraviolet light emitting device 1 is configured such that a nitride semiconductor ultraviolet light emitting element 10 is mounted on a base 30 by flip-chip mounting and sealed with an amorphous fluororesin whose terminal functional group is perfluoroalkyl group. The nitride semiconductor ultraviolet light emitting element 10 includes a sapphire substrate 11, a semiconductor laminated portion 12 of an AlGaN-based semiconductor laminated on a front surface of the sapphire substrate 11, an n electrode 13, a p electrode 14 and a back surface covering layer 15 which is formed on a back surface of the sapphire substrate 11 and transmits ultraviolet light. The back surface covering layer 15 has apertures 16 through which a part of the back surface of the sapphire substrate 11 is exposed, the apertures 16 is uniformly dispersed or distributed on the back surface of the sapphire substrate, a cross-sectional shape of the apertures 16 vertical to the back surface of the sapphire substrate 11 has a portion where an aperture width of a part
(Continued)

close to the back surface is wider than an aperture width of a part far from the back surface, and the amorphous fluororesin covers the front surface of the back surface covering layer 15 and fills insides of the apertures 16.

11 Claims, 10 Drawing Sheets

(51) Int. Cl.
| | |
|---|---|
| *H01L 33/20* | (2010.01) |
| *H01L 33/00* | (2010.01) |
| *H01L 33/06* | (2010.01) |
| *H01L 33/22* | (2010.01) |
| *H01L 33/32* | (2010.01) |
| *H01L 33/38* | (2010.01) |
| *H01L 33/44* | (2010.01) |
| *H01L 33/58* | (2010.01) |
| *H01L 33/62* | (2010.01) |
| *H01L 33/54* | (2010.01) |

(52) U.S. Cl.
CPC .............. *H01L 33/22* (2013.01); *H01L 33/32* (2013.01); *H01L 33/38* (2013.01); *H01L 33/44* (2013.01); *H01L 33/58* (2013.01); H01L 33/54 (2013.01); H01L 33/62 (2013.01); H01L 2933/005 (2013.01); H01L 2933/0016 (2013.01); H01L 2933/0025 (2013.01); H01L 2933/0066 (2013.01); H01L 2933/0083 (2013.01)

(56) References Cited

U.S. PATENT DOCUMENTS

| | | |
|---|---|---|
| 2012/0056525 A1 | 3/2012 | Ishida et al. |
| 2012/0132946 A1 | 5/2012 | Park |
| 2014/0168942 A1 | 6/2014 | Kishimoto et al. |
| 2015/0243856 A1 | 8/2015 | Yamada et al. |
| 2015/0295146 A1 | 10/2015 | Ikegami et al. |
| 2015/0295153 A1 | 10/2015 | Kuramoto et al. |

FOREIGN PATENT DOCUMENTS

| | | |
|---|---|---|
| JP | 2007311707 A | 11/2007 |
| JP | 2013030720 A | 2/2013 |
| JP | 2013062493 A | 4/2013 |
| JP | 2013084881 A | 5/2013 |
| TW | 201507215 A | 2/2015 |
| WO | 2014162650 A1 | 10/2014 |
| WO | 2014178288 A1 | 11/2014 |

OTHER PUBLICATIONS

Sumiya, et al., "AlGaN-Based Deep Ultraviolet Light-Emitting Diodes Grown on Epitaxial AlN/Sapphire Templates," Japanese Journal of Applied Physics, vol. 47, No. 1, Jan. 18, 2008, pp. 43-46.
Yamada et al., "Development of underfilling and encapsulation for deep-ultraviolet LEDs," Applied Physics Express 8, Dec. 5, 2014, 3 pages.

NITRIDE SEMICONDUCTOR ULTRAVIOLET LIGHT EMITTING DEVICE AND METHOD FOR MANUFACTURING SAME

TECHNICAL FIELD

The present invention relates to a nitride semiconductor ultraviolet light emitting device, and more particularly, to a back-surface emission type nitride semiconductor ultraviolet light emitting device which is sealed with an amorphous fluororesin, in which light emission having a center emission wavelength of about 350 nm or less is extracted from the back surface side of a substrate.

BACKGROUND ART

There have been heretofore many nitride semiconductor light emitting elements, such as LEDs (light emitting diodes) and semiconductor lasers, in which a light emitting element structure including a plurality of nitride semiconductor layers is formed on a substrate of sapphire or the like by epitaxial growth (see Non-Patent Documents 1 and 2 described below, for example). The nitride semiconductor layer is represented by the general formula: $Al_{1-x-y}Ga_xIn_yN$ ($0 \leq x \leq 1$, $0 \leq y \leq 1$, $0 \leq x+y \leq 1$).

The light emitting structure has a double-hetero structure in which an active layer including a nitride semiconductor layer of single-quantum-well structure (SQW) or multi-quantum-well structure (MQW) is sandwiched between an n-type nitride semiconductor layer and a p-type nitride semiconductor layer. When the active layer is an AlGaN-based semiconductor layer, by adjusting an AlN molar fraction (also called an Al composition ratio), band gap energy can be adjusted within a range where band gap energies that can be taken by GaN and AlN (about 3.4 eV and about 6.2 eV) are lower and upper limits, respectively, so that an ultraviolet light emitting element having a light emission wavelength of about 200 nm to about 365 nm can be obtained. Specifically, when a forward-current flows from the p-type nitride semiconductor layer to the n-type nitride semiconductor layer, light emission corresponding to the band gap energy occurs in the active layer.

On the other hand, in an implementation of the nitride semiconductor ultraviolet light emitting element, flip-chip mounting is generally adopted (see FIG. 4 of Patent Document 1 described below, for example). In the flip-chip mounting, the light emitted from the active layer passes through the AlGaN-based nitride semiconductor and the sapphire substrate having higher bandgap energy than the active layer and is extracted out of the element. Thus, in the flip-chip mounting, the sapphire substrate faces upward, and each of p-side and n-side electrode surfaces formed toward an upper surface side of a chip faces downward, so that the respective electrode surfaces on the chip side are electrically and physically connected to electrode pads on the side of a package component such as a submount through metal bumps formed on the respective electrode surfaces.

In general, as disclosed in FIGS. 4, 6 and 7 in Patent Document 2 or FIGS. 2, 4 and 6 in Patent Document 3 described below, the nitride semiconductor ultraviolet light emitting element is sealed with an ultraviolet light transmitting resin such as a fluorine-based resin or a silicone resin before it is put into practical use. The sealing resin protects an inside ultraviolet light emitting element from an outside atmosphere to prevent degradation of the light emitting element due to ingress of moisture, oxidation and the like. Further, the sealing resin may be provided as a refractive index difference mitigation material for improving light extraction efficiency by mitigating a reflection loss of light resulting from a refractive index difference between a light condensing lens and an ultraviolet light emitting element or a refractive index difference between a space to be irradiated with ultraviolet light and an ultraviolet light emitting element. Further, it is also possible to improve irradiation efficiency by shaping the surface of the sealing resin into a light condensing curved surface such as a spherical surface.

PRIOR ART DOCUMENTS

Patent Documents

Patent Document 1: WO 2014/178288
Patent Document 2: Japanese Unexamined Patent Application Publication No. 2007-311707
Patent Document 3: U.S. Patent Application Publication No. 2006/0138443
Patent Document 4: Japanese Unexamined Patent Application Publication No. 2006-348088

Non-Patent Documents

Non-Patent Document 1: Kentaro Nagamatsu, et al., "High-efficiency AlGaN-based UV light-emitting diode on laterally overgrown AlN", Journal of Crystal Growth, 2008, 310, pp. 2326-2329
Non-Patent Document 2: Shigeaki Sumiya, et al., "AlGaN-Based Deep Ultraviolet Light-Emitting Diodes Grown on Epitaxial AlN/Sapphire Templates", Japanese Journal of Applied Physics, Vol. 47, No. 1, 2008, pp. 43-46
Non-Patent Document 3: Kiho Yamada, et al., "Development of underfilling and encapsulation for deep-ultraviolet LEDs", Applied Physics Express, 8, 012101, 2015

SUMMARY OF THE INVENTION

Problems to be Solved by the Invention

As described above, the use of a fluorine-based resin, a silicone resin and the like as a sealing resin for an ultraviolet light emitting element has been proposed, but it is known that the degradation of the silicone resin progresses upon exposure to a large amount of high-energy ultraviolet light. Particularly, the ultraviolet light emitting elements having shorter wavelength and higher output are increasingly developed, so that the degradation due to exposure to ultraviolet light tends to be accelerated. Furthermore, an increase in power consumption associated with the enhancement of power causes an increase in heat generation, and such heat generation also raises the problem of degradation of the sealing resin.

Fluorine-based resins are known to have excellent heat resistance and high ultraviolet light resistance, but general fluororesins such as polytetrafluoroethylene are opaque. As for the fluorine-based resin, since a polymer chain is rectilinear and rigid, and easily crystallized, a crystalline portion and an amorphous portion are mixed, the light scatters at its interface, and the resin is made opaque.

Thus, for example, Patent Document 4 proposes that transparency to ultraviolet light is improved by using an amorphous fluororesin as a sealing resin for an ultraviolet light emitting element. Examples of amorphous fluororesins include one with a fluororesin of a crystalline polymer copolymerized and made amorphous as a polymer alloy, a copolymer of perfluoro dioxole (trade name: Teflon AF (registered trademark) produced by DuPont) and a cyclized polymer of perfluoro butenyl vinyl ether (trade name: CYTOP (registered trademark) produced by ASAHI GLASS Co., Ltd.). The fluororesin of the latter cyclized polymer is likely to become amorphous because its main chain has a cyclic structure, so that transparency is high.

The amorphous fluororesin is roughly divided into two kinds, that is, a bonding amorphous fluororesin having a reactive functional group such as carboxyl group which can be bonded to metal, and a non-bonding amorphous fluororesin having a functional group such as perfluoroalkyl group which is hard to bond to metal. Bonding property between a base and a fluororesin can be improved by using a bonding amorphous fluororesin for a surface of the base, on which a LED chip is mounted, and a portion covering the LED chip. In addition, in the present invention, the term "bonding" includes the meaning that there is an affinity for an interface of metal and the like. Similarly, the term "non-bonding" includes the meaning that there is no or a very small affinity for an interface of metal and the like.

On the other hand, Patent Document 1 and Non-Patent Document 3 describe that in the case where a bonding amorphous fluororesin having a reactive functional group whose terminal functional group has a metal-bonding property is used for a part to cover a pad electrode of a nitride semiconductor ultraviolet light emitting element which emits deep ultraviolet light having a center emission wavelength of 300 nm or less, when the ultraviolet light emitting operation is performed by applying a forward voltage to between metal electrode wirings connected to a p electrode and an n electrode of the ultraviolet light emitting element, respectively, the ultraviolet light emitting element is degraded in electric characteristics. Specifically, it has been confirmed that a resistive leak current path is formed between the p electrode and the n electrode of the ultraviolet light emitting element. According to Patent Document 1, in the case where the amorphous fluororesin is the bonding amorphous fluororesin, in the bonding amorphous fluororesin irradiated with a high-energy deep ultraviolet light, its reactive terminal functional group is separated and becomes a radical due to a photochemical reaction, which causes coordinate bonding with a metal atom composing the pad electrode, so that the metal atom is separated from the pad electrode. Furthermore, when an electric field is applied to the pad electrodes during the light emitting operation, the metal atom causes migration, so that a resistive leak current path is formed, and the short circuit is caused between the p electrode and the n electrode of the ultraviolet light emitting element.

Furthermore, Non-Patent Document 3 describes that, in the case where a bonding amorphous fluororesin is used, when stress is continuously applied to the bonding amorphous fluororesin by a deep ultraviolet light emitting operation, decomposition occurs due to a photochemical reaction of the amorphous fluororesin, and air bubbles are generated between the amorphous fluororesin, which covers the metal electrode wirings on the base side, and the metal electrode wirings.

Patent Document 1 and Non-Patent Document 3 recommend to use the non-boding fluororesin for a nitride semiconductor ultraviolet light emitting element which emits deep ultraviolet light, in order to prevent short circuit from occurring between a p electrode and an n electrode of the ultraviolet light emitting element and also prevent air bubbles from being generated between the amorphous fluororesin and the metal electrode wirings which result from a photochemical reaction.

However, as described above, the non-bonding amorphous fluororesin is hard to bond not only to metal but also to a back surface of a sapphire substrate which is in direct contact with the non-bonding amorphous fluororesin upon flip-chip mounting. That is, because of weakness in bonding due to Van der Waals force in an interface between the non-bonding amorphous fluororesin and the back surface of the sapphire substrate, if a repulsion stronger than the Van der Waals force occurs in the interface for some reasons, there is a possibility that a part of the amorphous fluororesin might be peeled off from the back surface of the sapphire substrate and a gap might be formed at the peeled part. If the gap is generated on the back surface of the sapphire substrate and gas such as air having a low refractive index intrudes into the gap, ultraviolet light is hindered from passing through the sapphire substrate toward the amorphous fluororesin, so that there is a risk that the extraction efficiency of ultraviolet light emission toward the outside of the element is decreased.

The present invention has been made in view of the above-mentioned problems, and an object of the present invention is to provide an ultraviolet light emitting device having high quality and high reliability by preventing degradation of electrical characteristics and decomposition of an amorphous fluororesin resulting from a photochemical reaction using a non-bonding amorphous fluororesin, and further preventing the amorphous fluororesin from being peeled off.

Means for Solving the Problem

For achieving the object described above, the present invention provides a nitride semiconductor ultraviolet light emitting device in which a nitride semiconductor ultraviolet light emitting element is mounted by flip-chip mounting on a base for flip-chip mounting, the nitride semiconductor ultraviolet light emitting element comprising: a sapphire substrate; a plurality of AlGaN-based semiconductor layers laminated on a front surface of the sapphire substrate; an n electrode formed of one or more metal layers; a p electrode formed of one or more metal layers; and a back surface covering layer formed of an inorganic compound that is formed on a back surface of the sapphire substrate and transmits ultraviolet light, wherein the back surface covering layer has apertures through which a part of the back surface of the sapphire substrate is exposed, the apertures are uniformly dispersed or distributed on the back surface of the sapphire substrate, and a cross-sectional shape of each of the apertures vertical to the back surface of the sapphire substrate has a portion where an aperture width of a part close to the back surface is wider than an aperture width of a part far from the back surface, the nitride semiconductor ultraviolet light emitting element is sealed with an amorphous fluororesin whose terminal functional group is perfluoroalkyl group, and the amorphous fluororesin covers a front surface of the back surface covering layer and fills insides of the apertures.

In the present invention, the AlGaN-based semiconductor is based on a ternary (or binary) compound expressed by a general formula of $Al_xGa_{1-x}N$ (x represents AlN mole fraction, $0 \leq x \leq 1$), is a group-III nitride semiconductor having bandgap energy equal to or higher than bandgap energy (about 3.4 eV) of GaN (x=0), and may contain a slight amount of In as long as the condition regarding the bandgap energy is satisfied.

In the nitride semiconductor ultraviolet light emitting device having the above feature, first, since the non-bonding amorphous fluororesin whose terminal functional group is perfluoroalkyl group is used as a resin for sealing the nitride semiconductor ultraviolet light emitting element, it is possible to prevent the above-described degradation of electrical characteristics and decomposition of an amorphous fluororesin resulting from a photochemical reaction in the case where a bonding amorphous fluororesin is used.

Furthermore, since the back surface covering layer having apertures is provided on the back surface of the sapphire substrate, the contact area between the amorphous fluororesin and the nitride semiconductor ultraviolet light emitting element is increased from the contact area in the case where the back surface covering layer is not provided to the total of contact areas of the back surface of the sapphire substrate exposed at the bottoms of the apertures, the upper surface of the back surface covering layer except for the apertures, and the side wall surfaces of the apertures of the back surface covering layer, so that Van der Waals bonds between the amorphous fluororesin and the nitride semiconductor ultraviolet light emitting element are increased. Furthermore, the cross-sectional shape of the apertures vertical to the back surface of the sapphire substrate has a portion where an aperture width of a part close to the back surface is wider than an aperture width of a part far from the back surface. In other words, the cross-sectional shape of the apertures has a forward tapered part in the case where the back surface covering layer side is defined as an upward direction with respect to the back surface of the sapphire substrate, for example. Namely, the side wall surfaces of the back surface covering layer facing the insides of the apertures at least partially have a reversed tapered shape or an overhung shape. For this reason, the amorphous fluororesin filled in the apertures is physically hard to detach. In addition, since the apertures are dispersedly provided on the back surface of the sapphire substrate, the amorphous fluororesin inside the apertures serves as an anchor, the whole of the amorphous fluororesin covering the back surface of the sapphire substrate is hard to detach. As a result, the adhesion between the amorphous fluororesin and the nitride semiconductor ultraviolet light emitting element is chemically and physically strengthened.

Furthermore, it is preferable that the nitride semiconductor ultraviolet light emitting device having the above feature is configured such that the back surface covering layer is a single-layer formed of any one of $HfO_2$, $ZrO_2$ and $SiO_2$, or a laminated body formed of at least any two of $HfO_2$, $ZrO_2$ and $SiO_2$. With this preferred aspect, a back surface covering layer that is transparent to ultraviolet light and has high ultraviolet light resistance can be achieved.

Furthermore, it is preferable that the nitride semiconductor ultraviolet light emitting device having the above feature is configured such that the refractive index of the back surface covering layer is greater than that of the sapphire substrate. With this preferred aspect, as will be described later, the light extraction efficiency of extracting ultraviolet light emission from the nitride semiconductor ultraviolet light emitting element through the amorphous fluororesin to the outside is improved.

Furthermore, it is preferable that the nitride semiconductor ultraviolet light emitting device having the above feature is configured such that the planarly-viewed shape of the apertures is any one of dot, stripe, lattice, concentric circle, concentric annular shape and spiral. With this preferred aspect, the apertures of the back surface covering layer can be provided so as to be approximately uniformly dispersed with respect to the back surface of the sapphire substrate.

Furthermore, it is preferable that the nitride semiconductor ultraviolet light emitting device having the above feature is configured such that a structural unit of the polymer or copolymer that forms the amorphous fluororesin has a fluorine-containing aliphatic cyclic structure.

Furthermore, the present invention provides a method for manufacturing the nitride semiconductor ultraviolet light emitting device having the above feature, the method having a first feature that a process of manufacturing the nitride semiconductor ultraviolet light emitting element comprises steps of:

after forming a plurality of AlGaN-based semiconductor layers, an n electrode formed of one or more metal layers and a p electrode formed of one or more metal layers above a front surface of a sapphire substrate, forming a resist layer on a back surface of the sapphire substrate, and then patterning the resist layer so that the resist layer becomes a predetermined planarly-viewed shape and its cross-sectional shape vertical to the back surface of the sapphire substrate has a portion where a width of a part close to the back surface is wider than a width of a part far from the back surface;

depositing a back surface covering layer which transmits ultraviolet light on the patterned resist layer and the back surface of the sapphire substrate which is not covered by the resist layer; and patterning the back surface covering layer by removing the patterned resist layer and the back surface covering layer deposited on the upper surface of the resist layer.

With the method for manufacturing the nitride semiconductor ultraviolet light emitting device having the first feature, it is possible to form a back surface covering layer on the back surface of the sapphire substrate of the nitride semiconductor ultraviolet light emitting element to be used in the nitride semiconductor ultraviolet light emitting device, the back surface covering layer having apertures provided dispersedly whose cross-sectional shape has a portion where an aperture width of a part close to the back surface is wider than an aperture width of a part far from the back surface. As a result, the nitride semiconductor ultraviolet light emitting device manufactured in the above manner can exhibit an effect that the adhesion between the amorphous fluororesin and the nitride semiconductor ultraviolet light emitting element is chemically and physically strengthened.

Furthermore, in the method for manufacturing the nitride semiconductor ultraviolet light emitting device having the first feature, it is preferable that the resist layer is a photoresist, and the step of patterning the resist layer comprises: after forming the photoresist on the back surface of the sapphire substrate, patterning the photoresist by performing exposure and development processes so that the photoresist becomes a predetermined planarly-viewed shape and its cross-sectional shape vertical to the back surface of the sapphire substrate has a portion where a width of a part close to the back surface is wider than a width of a part far from the back surface. With this preferred aspect, it is possible to form a back surface covering layer on the back surface of the sapphire substrate of the nitride semiconductor ultraviolet light emitting element by a well-known photolithography technique, the back surface covering layer having apertures provided dispersedly whose cross-sectional shape has a portion where an aperture width of a part close to the back surface is wider than an aperture width of a part far from the back surface.

Furthermore, the present invention provides the method for manufacturing the nitride semiconductor ultraviolet light emitting device having the above feature, as a second feature, the method comprising steps of: mounting the nitride semiconductor ultraviolet light emitting element by flip-chip mounting on the base by electrically and physically connecting the p electrode and the n electrode of the nitride semiconductor ultraviolet light emitting element to electrode pads formed on the base corresponding to the p electrode and the n electrode, respectively, through a boding material; and forming a resin layer of the amorphous fluororesin which covers a mount surface of the base on which the nitride semiconductor ultraviolet light emitting element is mounted, side walls of the nitride semiconductor ultraviolet light emitting element, a front surface of the back surface covering layer and opening surfaces of the apertures, and fills a gap between the mount surface of the base and the nitride semiconductor ultraviolet light emitting element and insides of the apertures of the back surface covering layer.

With the method for manufacturing the nitride semiconductor ultraviolet light emitting device having the second feature, since the nitride semiconductor ultraviolet light emitting element is sealed with a non-bonding amorphous fluororesin whose terminal functional group is perfluoroalkyl group and the gap between the mount surface of the base and the nitride semiconductor ultraviolet light emitting element is also filled with the same amorphous fluororesin, it is possible to prevent degradation of electrical characteristics and decomposition of an amorphous fluororesin resulting from a possible photochemical reaction accompanying an ultraviolet light emission operation in the case where a bonding amorphous fluororesin is used. Furthermore, since the insides of the apertures of the back face covering layer are also filled with the same amorphous fluororesin, the adhesion between the amorphous fluororesin and the nitride semiconductor ultraviolet light emitting element is chemically and physically strengthened.

Further preferably, the present invention provides a method for manufacturing the nitride semiconductor ultraviolet light emitting device having the above first and second features.

Furthermore, it is preferable that the method for manufacturing the nitride semiconductor ultraviolet light emitting device having the second feature comprises a step of, after the step of forming the resin layer, heating and softening the resin layer at a temperature within a range of 150° C. or more and 300° C. or less. With this preferred aspect, it is possible to enhance the adhesion of the resin layer filling the insides of the apertures to the side wall surfaces of the back surface covering layer facing the insides of the apertures and the back surface of the sapphire substrate that is exposed at the bottoms of the apertures, so that the adhesion between the amorphous fluororesin and the nitride semiconductor ultraviolet light emitting element is further strengthened.

Furthermore, it is preferable that the method for manufacturing the nitride semiconductor ultraviolet light emitting device having the second feature comprises a step of, after the step of forming the resin layer, pressing the resin layer toward the nitride semiconductor ultraviolet light emitting element, the resin layer covering the front surface of the back surface covering layer and the opening surfaces of the apertures and filling the insides of the apertures. With this preferred aspect, it is possible to enhance the adhesion of the resin layer filling the insides of the apertures to the side wall surfaces of the back surface covering layer facing the insides of the apertures and the back surface of the sapphire substrate that is exposed at the bottoms of the apertures, so that the adhesion between the amorphous fluororesin and the nitride semiconductor ultraviolet light emitting element is further strengthened.

Effect of the Invention

With the nitride semiconductor ultraviolet light emitting device having the above feature, by using a non-bonding amorphous fluororesin, it is possible to prevent deterioration of electrical characteristics and decomposition of an amorphous fluororesin resulting from a photochemical reaction, and it is further possible to prevent detachment of the amorphous fluororesin, so that an ultraviolet light emitting device with high quality and high reliability can be provided.

DESCRIPTION OF EMBODIMENTS

Figure 1:
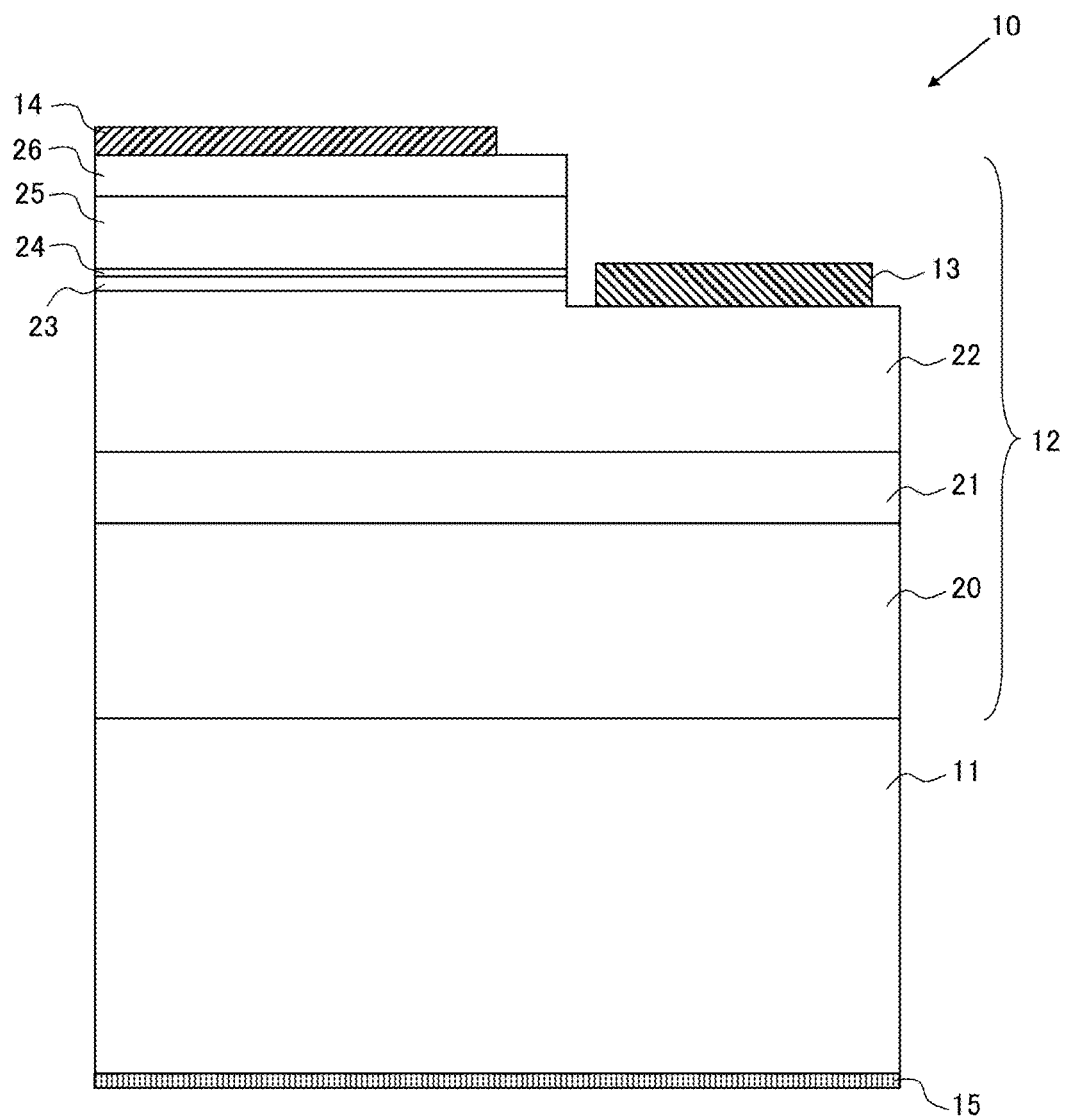
FIG. 1 is a cross-sectional view schematically showing one example of an element structure in one embodiment of a nitride semiconductor ultraviolet light emitting element in the present invention.

A nitride semiconductor ultraviolet light emitting device and a method for manufacturing the same in each of embodiments in the present invention will be described with reference to the drawings. In addition, for easy understanding of the description, an essential part is emphasized to schematically illustrate invention contents in the drawings used in the following description, so that a dimensional ratio of each part does not correspond to a dimensional ratio of an actual element and a component to be actually used. Hereinafter, a nitride semiconductor ultraviolet light emitting device in the present invention will be referred to as the "present light emitting device", a method for manufacturing the same will be referred to as the "present manufacturing method", and a nitride semiconductor ultraviolet light emitting element to be used in the present light emitting device will be referred to as the "present light emitting element", occasionally. Further, the description will be given supposing a case where the present light emitting element is a light emitting diode.

[Element Structure of the Present Light Emitting Element]

First, an element structure of the present light emitting element 10 will be described. As shown in FIG. 1, the basic element structure of the present light emitting element 10 includes a semiconductor laminated portion 12 formed of a plurality of AlGaN-based semiconductor layers, an n electrode 13, and a p electrode 14 on a front surface of a sapphire substrate 11, and a back surface covering layer 15 on the back surface of the sapphire substrate 11.

The semiconductor laminated portion 12, for example, is configured such that an AlN layer 20, an AlGaN layer 21, an n-type clad layer 22 formed of n-type AlGaN, an active layer 23, an electron block layer 24 of p-type AlGaN, a p-type clad layer 25 of p-type AlGaN, and a p-type contact layer 26 of p-type GaN are laminated in order from the sapphire substrate 11. A light emitting diode structure is formed by layers from the n-type clad layer 22 to the p-type contact layer 26. The sapphire substrate 11, the AlN layer 20 and the AlGaN layer 21 serve as a template for forming the light emitting diode structure thereon. A part of a laminated structure including the active layer 23, the electron blocking layer 24, the p-type clad layer 25 and the p-type contact layer 26 that are located above the n-type clad layer 22 is removed by reactive ion etching and the like until the surface of the n-type clad layer 22 is partially exposed. The etched semiconductor layers from the active layer 23 to the p-type contact layer 26 above an exposed surface of the n-type clad layer 22 are referred to as a "mesa portion" for descriptive purposes. The active layer 23 has a single-layer quantum well structure formed of an n-type AlGaN barrier layer and an AlGaN or GaN well layer, for example. The active layer 23 has only to have a double hetero junction structure in which it is sandwiched between the n-type and p-type AlGaN layers each having a higher AlN mole fraction from the upper and lower sides, or may have a multiple quantum well structure formed of a plurality of the above single-layer quantum well structures.

Each AlGaN layer is formed by a well-known epitaxial growth method such as metal-organic vapor phase epitaxy (MOVPE) method or molecular beam epitaxy (MBE) method, in which Si is used as a donor impurity for the n-type layer, and Mg is used as an acceptor impurity for the p-type layer, for example.

An n electrode 13 formed of Ti/Al/Ti/Au, for example, is formed on the exposed surface of the n-type clad layer 22, and a p electrode 14 formed of Ni/Au, for example, is formed on a surface of the p-type contact layer 26. In addition, the number and materials of the metal layers in each of the n electrode 13 and the p electrode 14 are not limited to the above number and materials.

Furthermore, in the present embodiment, a planarly-viewed shape of a chip of the present light emitting element 10 is a square, and a surface of the n-type clad layer 22 is exposed in the outer peripheral portion of the chip so as to surround the above-described mesa portion which is located at the center. Furthermore, a configuration example in which the exposed area is larger at the four corners of the chip, and the n electrodes 13 are formed at each of the four corners, one p electrode 14 is formed on the top of the mesa portion is supposed. Note that the planarly-viewed shape of the chip of the present light emitting element 10, the planarly-viewed shape of the mesa portion, the number and position of the n electrodes 13 and the p electrodes 14 are not limited to the above-exemplified shapes, number and positions.

The present light emitting element 10 is characterized in that a back surface covering layer 15 is provided on the back surface of the sapphire substrate 11. The semiconductor laminated portion 12, the n electrode 13 and the p electrode 14 formed at the side of the front surface of the sapphire substrate 11 are not limited to the above-exemplified configuration and structure, and a variety of well-known configurations and structures may be adopted. The present light emitting element 10 may also include any component, such as a protective layer, other than the semiconductor laminated portion 12, the n electrode 13 and the p electrode 14. Therefore, detailed descriptions such as the thicknesses of the AlGaN layers 20 to 26 and the electrodes 13 and 14 are omitted. However, the AlN mole fraction of the AlGaN layers 21 to 25 is accordingly set such that the central emission wavelength of the present light emitting element 10 is about 350 nm or less, and light is emitted through the sapphire substrate 11.

The back surface covering layer 15 is formed of an inorganic compound that transmits ultraviolet light and has apertures 16 through which a part of the back surface of the sapphire substrate 11 is exposed. The apertures 16 are not shown in FIG. 1. As an inorganic compound which composes the back surface covering layer 15, $HfO_2$, $ZrO_2$, $SiO_2$ and the like can be used. Furthermore, it is preferable that the back surface covering layer 15 is a single-layer formed of any one of $HfO_2$, $ZrO_2$ and $SiO_2$, or a laminated body formed of at least any two of $HfO_2$, $ZrO_2$ and $SiO_2$. In the present embodiment, the back surface covering layer 15 is supposed to be a single layer of $HfO_2$. $HfO_2$ is particularly preferable because $HfO_2$ has bandgap energy of 6 eV which is approximately equal to that of sapphire, transmits ultraviolet light up to a deep ultraviolet region whose wavelength is about 220 nm, and has a refractive index of about 2.1 which is higher than the refractive index (about 1.8) of sapphire. $ZrO_2$ generally has bandgap energy of about 4 eV to 5 eV which is smaller than that of sapphire, transmits ultraviolet light up to a deep ultraviolet region whose wavelength is about 340 nm, and has a refractive index of about 2.2 which is higher than the refractive index (about 1.8) of sapphire. In addition, as for $ZrO_2$, there is a possibility that its bandgap energy extends up to around 6 eV to 7 eV depending on impurities or crystal structures, and in that case, $ZrO_2$ can transmit ultraviolet light up to a deep ultraviolet region whose wavelength is about 220 nm. Although $SiO_2$ has bandgap energy of about 8 eV which is higher than that of sapphire and transmits ultraviolet light up to a deep ultraviolet region whose wavelength is about 200 nm, its refractive index is about 1.5 which is lower than the refractive index (about 1.8) of sapphire.

Figure 2:
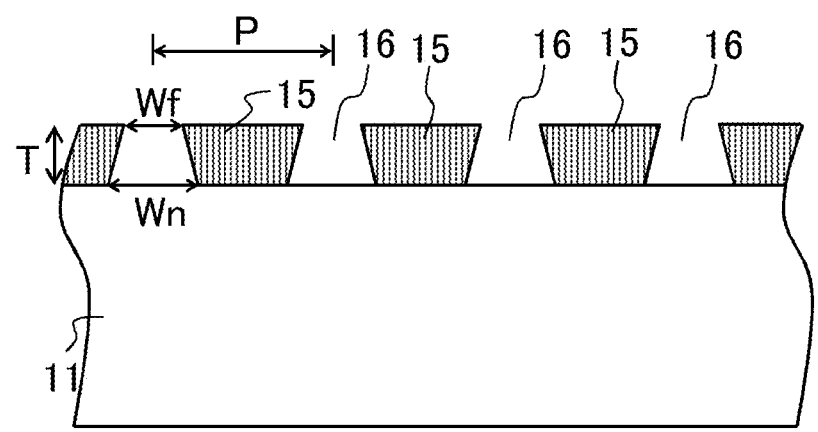
FIG. 2 is an essential part cross-sectional view schematically showing one example of a cross-sectional structure of the back surface covering layer of the nitride semiconductor ultraviolet light emitting element shown in FIG. 1 in a cross section vertical to the back surface of the sapphire substrate.
Figure 3A:
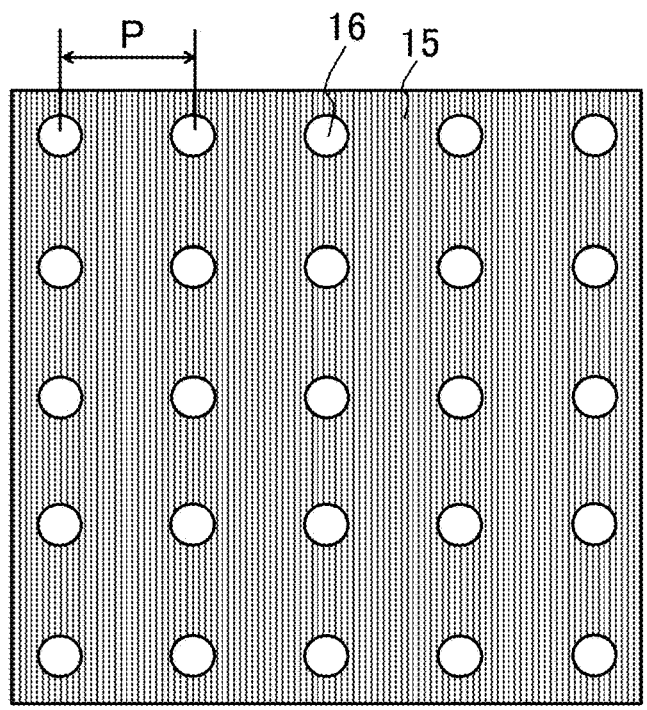
FIGS. 3A and 3B are plane views schematically showing arrangement examples of the apertures of the back surface covering layer.
Figure 3B:
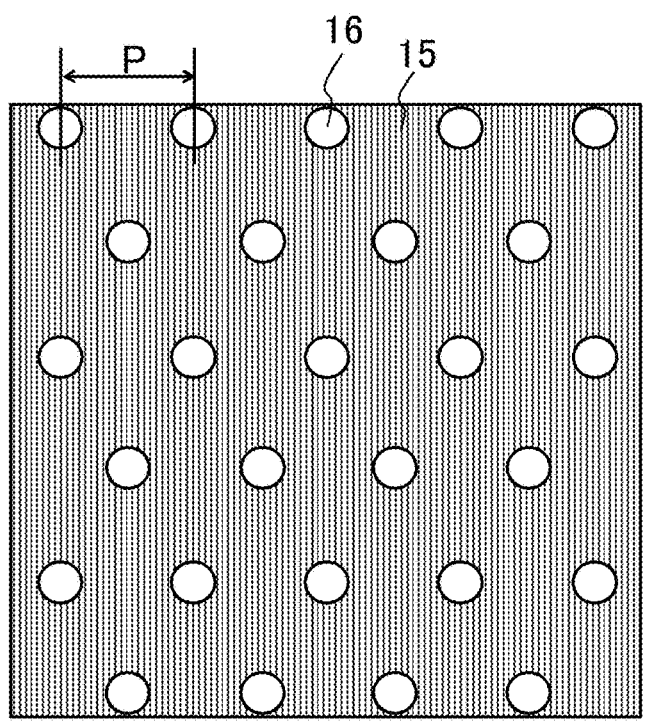
Figure 4A:
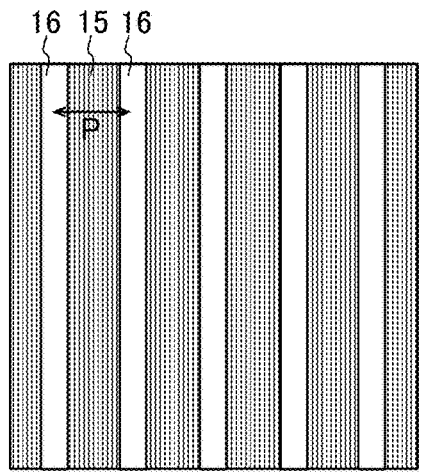
FIGS. 4A to 4E are plane views schematically showing some representative examples of planarly-viewed shapes of the apertures of the back surface covering layer.
Figure 4B:
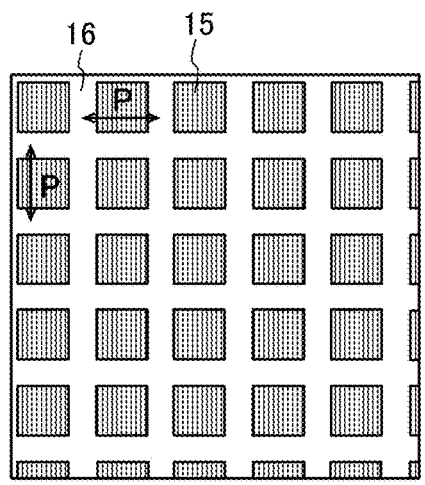
Figure 4C:
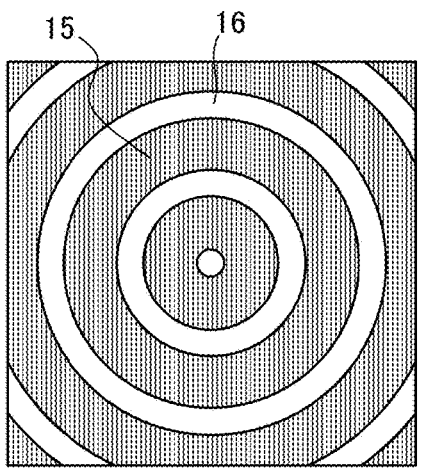
Figure 4D:
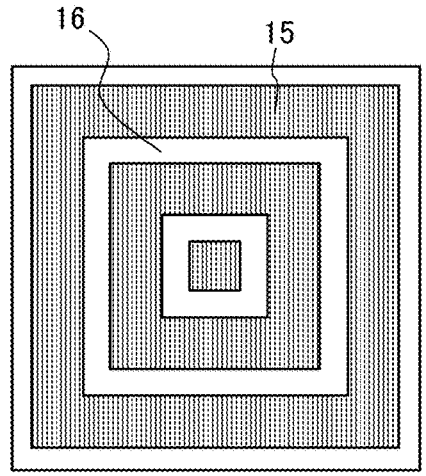
Figure 4E:
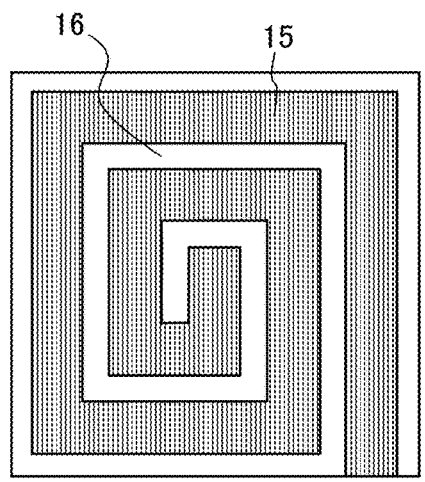

FIG. 2 is an essential part enlarged view schematically showing a cross-sectional structure of the back surface covering layer 15 in a cross section vertical to the back surface of the sapphire substrate 11. As shown in FIGS. 3A-3B and 4A-4E, the apertures 16 are arranged on the back surface of the sapphire substrate 11 so that they are uniformly dispersed or distributed. FIGS. 3A and 3B are essential part enlarged views schematically showing examples of the arrangement of the apertures 16 of the back surface covering layer 15 as seen from the back surface side of the sapphire substrate 11 in the case where a planarly-viewed shape of the apertures 16 is a round dot shape. In FIG. 3A, the dot shaped apertures 16 are arranged in a square lattice pattern with an arrangement pitch P, and in FIG. 3B, the dot shaped apertures 16 are arranged in a triangle lattice pattern with the arrangement pitch P. FIGS. 4A to 4E are essential part enlarged views each schematically showing a part of the back surface covering layer 15 in the case where the planarly-viewed shape of the apertures 16 is stripe, lattice, concentric circle, concentric annular shape or spiral, other than dot, as representative examples of the planarly-viewed shape of the apertures 16. In addition, FIG. 2 shows a view where the back surface of the sapphire substrate 11 faces upward, that is, the view is turned upside down compared to FIG. 1. Furthermore, in FIGS. 3A-3B and 4A-4E, the part indicated by a striped pattern is the back surface covering layer 15, the void part is the apertures 16, and the part exposed through the apertures 16 is the back surface of the sapphire substrate 11.

As shown in FIG. 2, a cross-sectional shape at the cross section of the apertures 16 has a portion where an aperture width Wn of a part close to the back surface of the sapphire substrate 11 is wider than an aperture width Wf of a part far from the back surface, and has a roughly forward tapered shape. Note that the term of "forward tapered", "reverse tapered" or "overhung" is used on condition that the side of the back surface covering layer 15 is defined as an upper direction on the basis of the back surface of the sapphire substrate 11. In the example shown in FIG. 2, the aperture width Wn at the closest position to the back surface of the sapphire substrate 11 is the maximum width of an aperture width W, and the aperture width Wf at the farthest position from the back surface is the minimum width of the aperture width W. However, the position where the aperture width W becomes minimum or maximum is not limited to the example shown in FIG. 2 as long as there is a roughly forward tapered shape somewhere in the cross-sectional shape of the apertures 16. Furthermore, the upper surface of the back surface covering layer 15 is not necessarily a flat surface, and a part or all of the periphery of the apertures 16 may protrude or retreat to the back surface side of the sapphire substrate 11, for example.

It is preferable that a film thickness T of the back surface covering layer 15 is set to 0.3 µm or more. The upper limit of the film thickness T is not limited to a certain value, but if it is too large, the back surface covering layer 15 and the apertures 16 become difficult to form, so that the upper limit is preferably set to around 1 µm to 3 µm. The aperture width W (from the minimum width to the maximum width in one cross section) and the arrangement pitch P of the apertures 16 are not particularly limited to certain numerical ranges, but, as an example, in the case where the planarly-viewed shape of the apertures 16 is a round dot shape, the aperture width (aperture diameter) W is preferably the film thickness T or more and about several times the film thickness T or less, and the arrangement pitch P preferably falls within a range of about 1.5 to 3 times the maximum value of the aperture width (aperture diameter) W, for example. Also in the case where the planarly-viewed shape of the apertures 16 is any dot shape of a square, a regular hexagon or the like other than a circle, the aperture width W and the arrangement pitch P may be set in accordance with the case where the planarly-viewed shape is a circle. Furthermore, in the case where the planarly-viewed shape of the apertures 16 is any of stripe, lattice, concentric circle, concentric annular shape, spiral or the like, other than a dot shape, in a cross-sectional shape at a cross section vertical to the extending direction of the apertures 16 and the back surface of the sapphire substrate 11, the aperture width W and the arrangement pitch P may be set in accordance with the case where the planarly-viewed shape is a round dot shape.

In addition, in examples shown in FIGS. 3A-3B and 4A-4E, although the apertures 16 of the back surface covering layer 15 are periodically or regularly arranged with a certain arrangement pitch P, the apertures 16 is not necessarily periodically or regularly arranged as long as the apertures 16 are uniformly dispersed to some extent over the whole surface of the back surface covering layer 15 parallel to the back surface of the sapphire substrate 11.

[Configuration Example of the Present Light Emitting Device]

Figure 5:
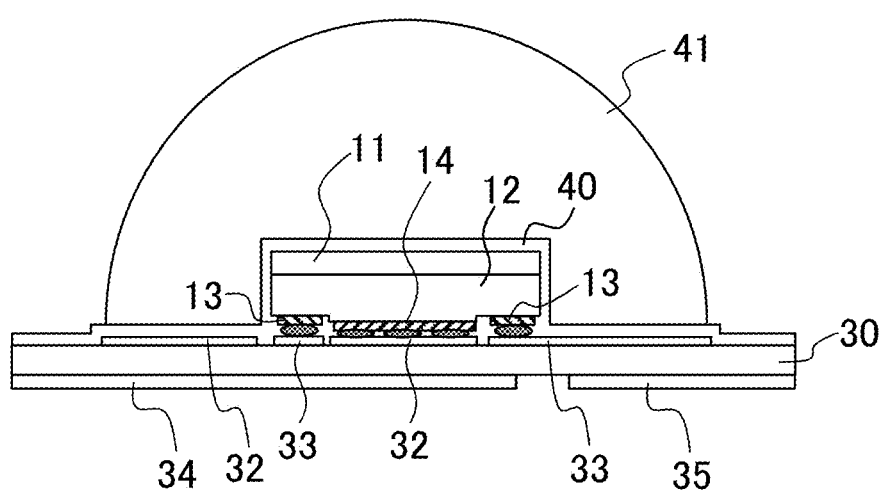
FIG. 5 is a cross-sectional view schematically showing one example of a cross-sectional structure in one embodiment of a nitride semiconductor ultraviolet light emitting device in the present invention.

Next, with reference to FIGS. 5 and 6A-6B, a description will be given for the present light emitting device 1 in which the present light emitting element 10 is mounted by a flip-chip mounting method on a submount 30 serving as a base for flip-chip mounting. FIG. 5 schematically shows a general cross-sectional structure of one configuration example of the present light emitting device 1. In FIG. 5, the light emitting element 10 is shown so that the back surface of the sapphire substrate 11 faces upward, as with FIG. 2. In the following description with reference to FIGS. 2 and 5, a direction of the present light emitting element 10 as seen from the mounting surface of the submount 30 is defined as an upper direction.

Figure 6A:
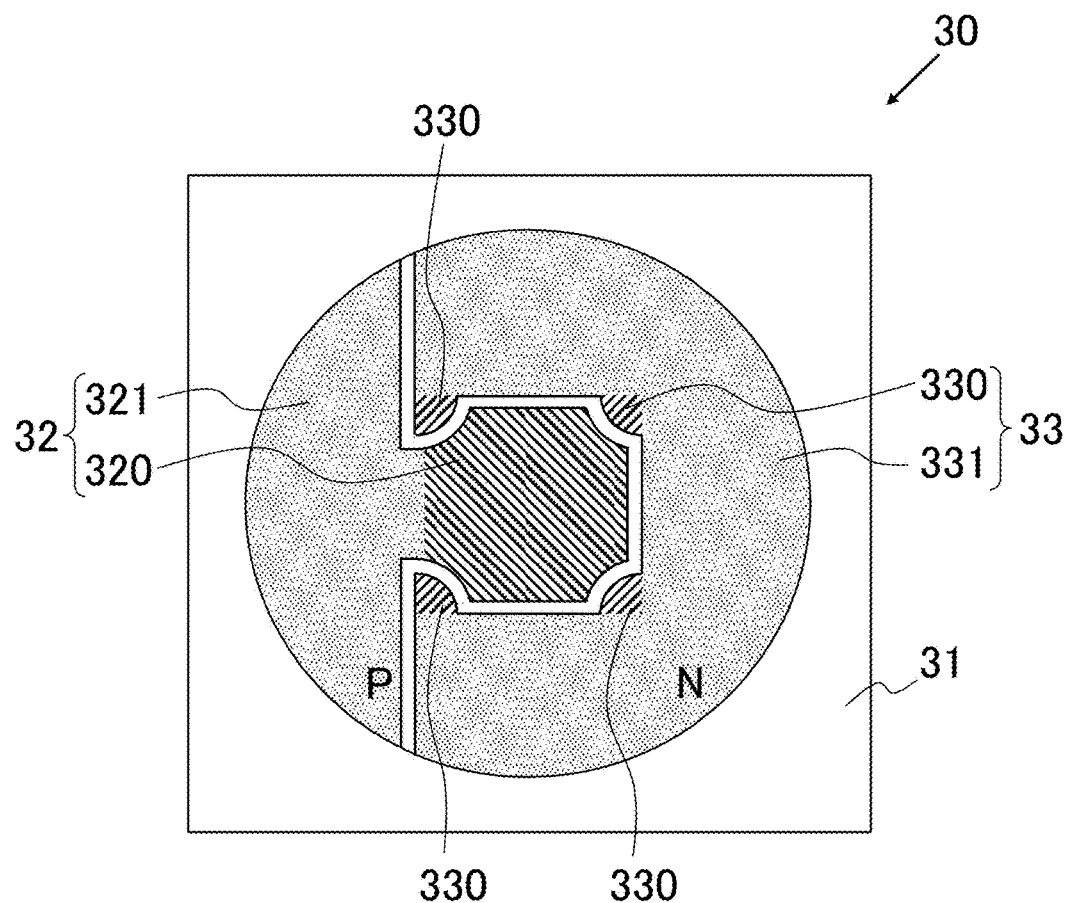
FIGS. 6A and 6B are a plane view and a cross-sectional view schematically showing a planarly-viewed shape and a cross-sectional shape of a submount to be used in the nitride semiconductor ultraviolet light emitting device shown in FIG. 5, respectively.
Figure 6B:
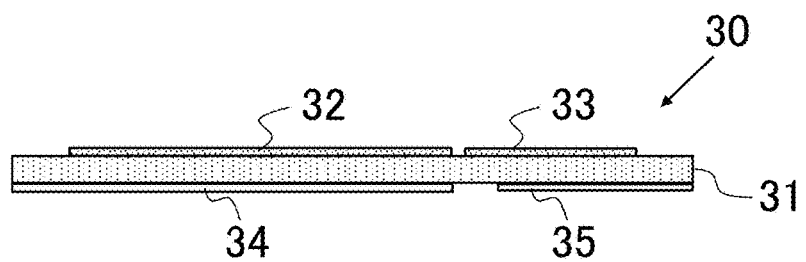

FIG. 6A is a plan view showing a planarly-viewed shape of the submount 30, and FIG. 6B is a cross-sectional view showing a cross-sectional shape at a cross section which is vertical to the surface of the submount 30 and passes through a center of the submount 30 in the plan view of FIG. 6A. The length of one side of the submount 30 is not limited to a certain value as long as there is a margin to form a sealing resin around the present light emitting element 10 mounted on the submount 30. As an example, the length of one side of a planarly-viewed square submount 30 is preferably more than about 1.5 to 2 times the chip size (the length of one side) of the planarly-viewed square present light emitting element 10 to be mounted on the submount 30. In addition, the planarly-viewed shape of the submount 30 is not limited to a square shape.

The submount 30 includes a base material 31 like a flat plate formed of insulation materials such as an insulating ceramic. A first metal electrode wiring 32 of an anode side and a second metal electrode wiring 33 of a cathode side are formed on a front surface side of the base material 31. Lead terminals 34 and 35 are formed on a back surface side of the base material 31. The first and second metal electrode wirings 32 and 33 on the front surface side of the base material 31 are connected to the lead terminals 34 and 35 on the back surface side of the base material 31, respectively, through penetration electrodes (not shown) provided in the base material 31. In the case where the submount 30 is mounted on another wiring substrate or the like, metal wirings on the wiring substrate are electrically connected to the lead terminals 34 and 35. Furthermore, the lead terminals 34 and 35 cover the almost entire back surface of the base material 31 and serve as a heat sink.

As shown in FIGS. 6A and 6B, the first and second metal electrode wirings 32 and 33 are formed at a part where the present light emitting element 10 is to be mounted in a center portion of the base material 31 and around it, and the first and second metal electrode wirings 32 and 33 are spaced apart from each other to be electrically separated. The first metal electrode wiring 32 includes a first electrode pad 320 and a first wiring portion 321 connected to the first electrode pad 320. Furthermore, the second metal electrode wiring 33 includes four second electrode pads 330 and a second wiring portion 331 connected to the second electrode pads 330. The first electrode pad 320 has a planarly-viewed shape slightly larger than the planarly-viewed shape of the p electrode 14 of the present light emitting element 10, and is located at the center of the center portion of the base material 31. The planarly-viewed shapes, number and positions of the second electrode pads 330 are set such that when the present light emitting element 10 is disposed with the p electrode 14 of the present light emitting element 10 facing the first electrode pad 320, the n electrodes 13 face the second electrode pads 330, respectively. In FIG. 6A, hatching is applied to the first electrode pad 320 and the second electrode pads 330, respectively. In addition, the planarly-viewed shapes of the first and second metal electrode wirings 32 and 33 are not limited to those shown in FIG. 6A, and various modifications are possible as long as the p electrode 14 faces the first electrode pad 320 and the n electrodes 13 face the second electrode pads 330.

In the present embodiment, the base material 31 of the submount 30 is formed of an insulation material such as aluminum nitride (AlN) which does not deteriorate due to exposure to ultraviolet light. The base material 31 is preferably AlN in terms of heat radiation, but may be silicon carbide (SiC), silicon nitride (SiN), boron nitride (BN) or a ceramic such as aluminum oxide ($Al_2O_3$). In addition, the base material 31 is not limited to a solid material of the insulation material, and may be a sintered body which is formed by combining particles of the insulation material with high density using silica glass as a binder, or further may be a diamond-like carbon (DLC) thin film, an industrial diamond thin film, or the like.

In addition, in the case where the submount 30 does not have the lead terminals 34 and 35 on the back surface side of the base material 31, the base material 31 is not formed of only an insulation material, but may be a laminated structure including a metal layer (i.e. Cu, Al, etc.) and an insulation layer formed of the above-described insulation material.

The first and second metal electrode wirings 32 and 33 includes, for example, a thick plated film formed of copper and a single or multiple layer surface metal film covering the surface (upper surface and side wall surface) of the thick plated film. The outermost layer of the surface metal film includes metal (such as gold (Au), platinum group metal (Ru, Rh, Pd, Os, Ir, Pt, or alloy formed of any two or more of these platinum group metals) or alloy of gold and platinum group metal) having smaller ionization tendency than copper composing the thick plated film.

The present light emitting element 10 is mounted and fixed on the center portion of the base material 31 such that the n electrodes 13 and the p electrode 14 face downward, the p electrode 14 and the first electrode pad 320 are facing each other and electrically and physically connected through gold bump and the like (corresponding to bonding material), and four n electrodes 13 and four second electrode pads 330 are facing each other and electrically and physically connected through gold bumps and the like. As shown in FIG. 5, the present light emitting element 10 mounted on the submount 30 is sealed with a sealing resin 40. Specifically, the upper surface of the present light emitting element 10 (the upper surface of the back surface covering layer 15 and the opening surfaces of the apertures 16), the side wall of the present light emitting element 10 and the upper surface of the submount 30 (the upper and side surfaces of the first and second metal electrode wirings 32 and 33, and the surface of the base material 31 exposed between the first and second electrode wirings 32 and 33) are covered with the sealing resin 40. Furthermore, the gap between the submount 30 and the present light emitting element 10 is filled with the sealing resin 40. Furthermore, in the present embodiment, the insides of the apertures 16 are filled with the sealing resin 40, and the sealing resin 40 filled in the apertures 16 serves as an anchor due to the cross-sectional shape of the apertures 16 whose openings become narrower upward, so that the adhesion between the sealing resin 40 and the upper surface of the present light emitting element 10 is enhanced.

In the present embodiment, as shown in FIG. 5, the upper surface of the sealing resin 40 is, for example, covered with a condenser lens 41 made of the same fluororesin as the sealing resin 40. The lens 41 is not limited to the one made of fluororesin, but may be made of other materials that have an ultraviolet light transparency suitable for the light emission wavelength of the present light emitting element 10. Although it is preferable that the lens 41 is made of the material that has a small difference in refraction index from the sealing resin 40, even a lens made of quartz glass can be used, for example. The lens 41 may be a light-diffusing lens for the intended use, other than the condenser lens, but is not necessarily required.

In this embodiment, a non-bonding amorphous fluororesin, which is excellent in heat resistance, ultraviolet light resistance, and ultraviolet light transparency, is used as the sealing resin 40. As described above, examples of amorphous fluororesin include one with a fluororesin of a crystalline polymer copolymerized and made amorphous as a polymer alloy, a copolymer of perfluoro dioxole (trade name: Teflon AF (registered trademark) produced by DuPont) and a cyclized polymer of perfluoro butenyl vinyl ether (trade name: CYTOP (registered trademark) produced by ASAHI GLASS Co., Ltd.). An amorphous fluororesin used in the present embodiment is, as an example, a non-bonding amorphous fluororesin in which a structural unit that forms a polymer or a copolymer has a fluorine-containing aliphatic cyclic structure, and a terminal functional group is a perfluoroalkyl group such as $CF_3$. A perfluoroalkyl group is hard to bond to metal and the like. That is, the non-bonding amorphous fluororesin does not have a reactive terminal functional group which bonds to metal. On the other hand, as for a bonding amorphous fluororesin, even if a structural unit that forms a polymer or a copolymer has the same fluorine-containing aliphatic cyclic structure as the non-bonding amorphous fluororesin, a bonding amorphous fluororesin is different from the non-bonding amorphous fluororesin in that its terminal functional group is a reactive functional group which can bond to metal. The reactive functional group is, as example, a carboxyl group (COOH) or an ester group (COOR). R represents an alkyl group.

Preferable as a structural unit having a fluorine-containing aliphatic cyclic structure are units based on a cyclic fluorine-containing monomer (hereinafter referred to as "unit A") or units formed by cyclopolymerization of diene fluorine-containing monomers (hereinafter referred to as "unit B"). In addition, since the composition and structure of the amorphous fluororesin are not the main idea of the present invention, the detailed description for these units A and B is omitted. Regarding the units A and B, see the detailed description in paragraphs [0031] to [0062] of Patent Document 1 filed by the same applicant as the present application.

One example of a commercial product of a non-bonding amorphous fluororesin is CYTOP (produced by ASAHI GLASS Co., Ltd.). CYTOP, the terminal functional group of which is $CF_3$, is a polymer of the unit B which is represented by the following chemical formula 1.

[Chemical Formula 1]

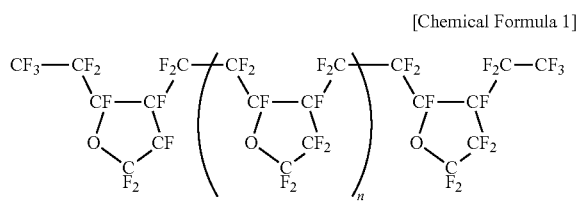

[Regarding Light Extraction Efficiency]

Next, the light extension efficiency of the present light emitting device 1 will be discussed. In the following description, it is premised that the refractive index of the sealing resin 40 is lower than that of the sapphire substrate 11.

As described above, the present light emitting device 1 includes the present light emitting element 10 in which light having a center emission wavelength of about 350 nm or less is extracted from the back surface side of the substrate. A p-type contact layer 26 of the present light emitting element 10 is formed of p-type GaN because the composition ratio of Al needs to be limited to an extremely small value in order to form an excellent ohmic junction between the p-type contact layer and the p electrode 14. Although the ultraviolet light emitted in an active layer 23 is radiated toward all directions, the light radiated toward the p-type contact layer 26 is absorbed by the p-type contact layer 26 and does not contribute to the light extraction efficiency. That is, among the ultraviolet light emitted in the active layer 23, only the light radiated toward the side of the sapphire substrate 11 contributes to the light extraction efficiency. Contrary to this, in a light emitting element which emits ultraviolet light having a long wavelength (a center emission wavelength is about 365 nm or more) and visible light, by providing a conductive reflective layer between the p electrode 14 and the p-type contact layer 26, the light radiated toward the p-type contact layer 26 is reflected by the reflective layer toward the side of the sapphire substrate 11 and effectively utilized, so that the light extraction efficiency can be improved. Therefore, in the present light emitting element 10, it is a problem how to efficiently extract the light emitted toward the side of the sapphire substrate 11 to the outside.

Figure 7:
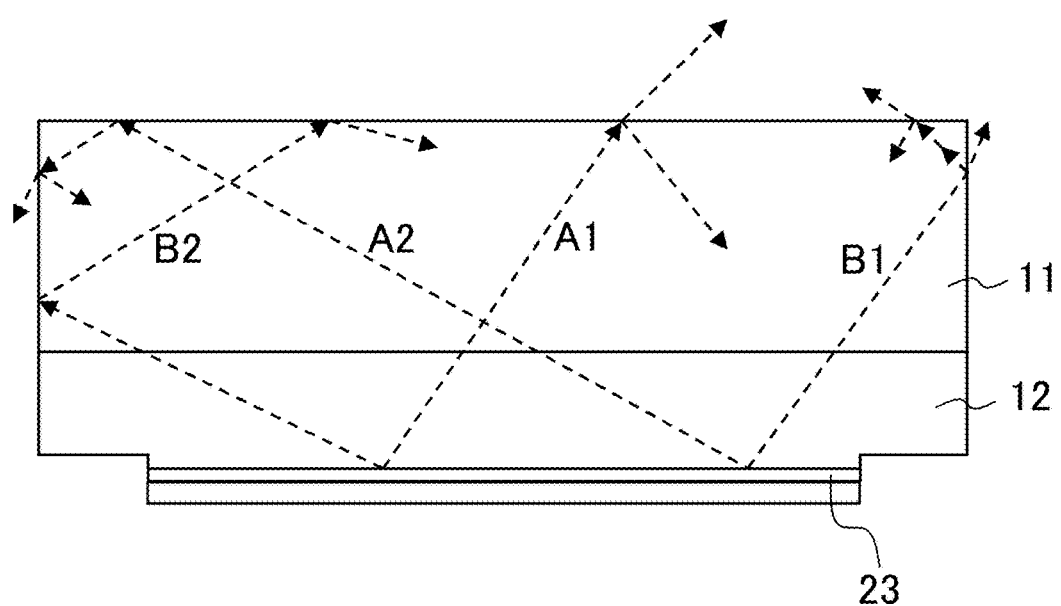
FIG. 7 is a view schematically showing a plurality of paths through which light emitted from the active layer reaches the back surface of the sapphire substrate.

As shown in FIG. 7, the light emitted from the active layer 23 includes: light which directly reaches the back surface of the sapphire substrate 11 (A1, A2); light which reaches the back surface of the sapphire substrate 11 after being reflected once by the side surface of the sapphire substrate 11 (B1, B2); light which is not totally reflected, a part of which is reflected and the other part of which is refracted by the back surface of the sapphire substrate 11 and passes through it (A1, B1); and light which is totally reflected by the back surface of the sapphire substrate 11 (A2, B2). Since the light, which enters the back surface of the sapphire substrate 11 from the side of the sapphire substrate 11 and is partially or totally reflected, proceeds toward the side of the p-type contact layer 26 with the traveling direction of the light reversed, if the light is absorbed in the p-type contact layer 26, it does not contribute to the light extraction efficiency. In addition, for descriptive purpose, FIG. 7 shows a case where a back surface covering layer 15 is not formed.

Total reflection occurs in the case where light enters from a medium having a high refractive index to another medium having a low refractive index and its incident angle is equal to or larger than the critical angle that is determined by the refractive index ratio of both the mediums. The refractive index of the sapphire substrate 11 is about 1.8, the refractive index of a non-bonding amorphous fluororesin used for the sealing resin 40 in the present embodiment is about 1.35 (the wavelength is 350 nm or less) in the case where the non-bonding amorphous fluororesin is CYTOP described above, and the refractive index of $HfO_2$ is about 2.1. Accordingly, in the case where the back surface covering layer 15 is not formed as shown in FIG. 7, total reflection can occur on the whole of the back surface of the sapphire substrate 11. However, since the back surface covering layer 15 made of a material having a refractive index larger than that of the sapphire substrate 11 is provided in the present light emitting element 10, total reflection does not occur on the interface between the back surface of the sapphire substrate 11 and the back surface covering layer 15, and a part of the light, which enters the interface from the side of the sapphire substrate 11, passes through the interface toward the back surface covering layer 15. Therefore, in this regard, the transmittance of the light which enters the back surface of the sapphire substrate 11 becomes high by providing the back surface covering layer 15 made of a material having a refractive index larger than that of the sapphire substrate 11, so that it is expected to contribute to the light extraction efficiency. However, in the case where the back surface covering layer 15 is provided on the whole back surface of the sapphire substrate 11, the light, which should be totally reflected if there was no back surface covering layer 15, cannot be expected to make a substantial effect because total reflection occurs on the interface between the upper surface of the back surface covering layer 15 and the sealing resin 40.

Figure 8:
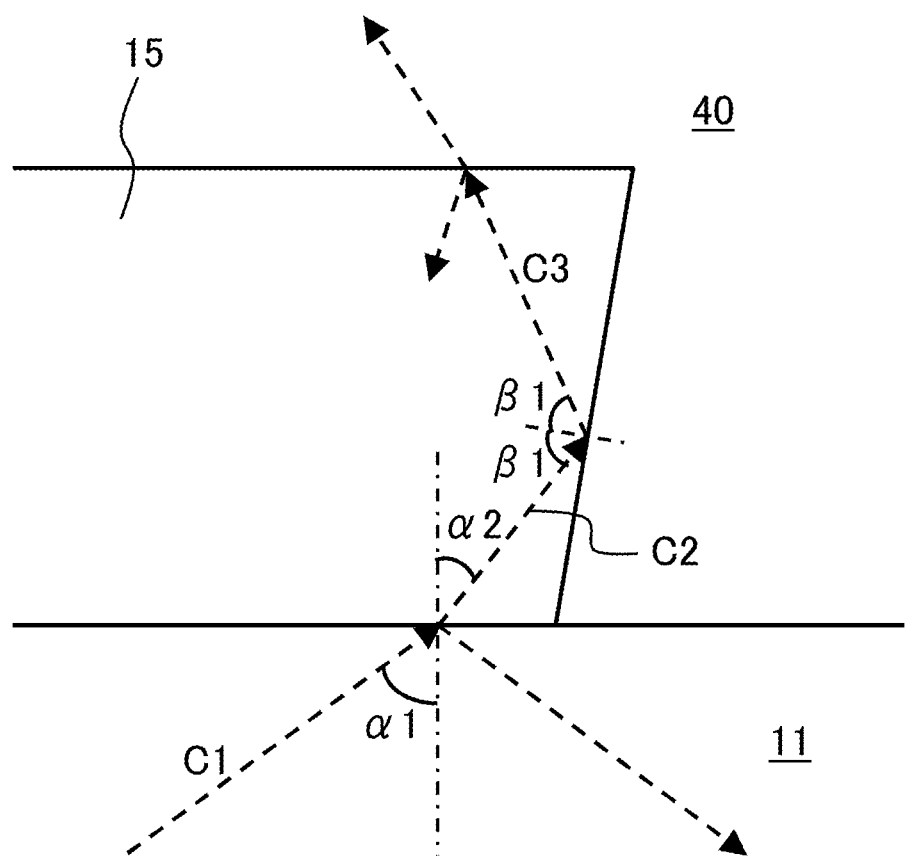
FIG. 8 is a view schematically showing the manner of reflection and refraction of light in the back surface covering layer and the apertures.

However, in the present light emitting element 10, since the apertures 16 having a forward tapered cross-sectional shape are provided, total reflection is substantially suppressed on the interface between the upper surface of the back surface covering layer 15 and the sealing resin 40. Specifically, as schematically shown in FIG. 8, the light (C1) entering the back surface covering layer 15 at an incident angle of $\alpha 1$, which should be totally reflected if there was no back surface covering layer 15, is not totally reflected, and a part of the light is refracted at an output angle $\alpha 2$ ($\alpha 2 < \alpha 1$) and is emitted into the back surface covering layer 15. The part of the light (C2) which is emitted into the back surface covering layer 15 does not directly reach the interface between the upper surface of the back surface covering layer 15 and the sealing resin 40 and enters the side surface of the back surface covering layer 15 at an incident angle of $\beta 1$, a part of which (C3) is reflected at a reflection angle of $\beta 1$ and reaches the upper surface of the back surface covering layer 15 and the sealing resin 40. The light (C3) which is reflected once on the side surface of the back surface covering layer 15 has a small incident angle and thus is not totally reflected, a part of which necessarily passes through the interface between the upper surface of the back surface covering layer 15 and the sealing resin 40, and is emitted to the side of the sealing resin 40.

In the case where the dot shaped apertures 16 are arranged, since the back surface covering layer 15 continues in a lattice pattern, among the light (C2) emitted into the back surface covering layer 15, the part whose emitting direction has a component in a longitudinal direction of the lattice can directly reach the interface between the upper surface of the back surface covering layer 15 and the sealing resin 40. A part of the light, which directly reaches the interface between the upper surface of the back surface covering layer 15 and the sealing resin 40, is totally reflected and enters the side surface of the back surface covering layer 15 at an incident angle of $\gamma 1$, a part of which is reflected at a reflection angle of $\gamma 1$ and enters the opposite side surface of the back surface covering layer 15 again. While a part of the light may be reflected, another part of the light may be refracted and enter the sealing resin 40 inside the apertures 16. On the other hand, as for the side surface of the back surface covering layer 15, since the back surface covering layer 15 has a reverse tapered shape, when the light, which enters the side surface of the back surface covering layer 15 again, repeats reflection more than twice on the side surface of the back surface covering layer 15, the traveling direction of the light may be reversed upward. Furthermore, since the light, which is reflected at least once on the side surface of the back surface covering layer 15 and enters the interface between the back surface covering layer 15 and the back surface of the sapphire substrate 11, enters the interface at an incident angle larger than the reflection angle at the upper surface of the back surface covering layer 15, the light is totally reflected on the interface, so that the traveling direction of the light may be reversed upward. Therefore, there is a possibility that a part of the light, which directly reaches the interface between the upper surface of the back surface covering layer 15 and the sealing resin 40 and is totally reflected on the interface, is emitted to the side of the sealing resin 40 with the traveling direction reversed upward.

On the other hand, the light, which directly enters the sealing resin 40 inside the apertures 16 from the back surface of the sapphire substrate 11, is refracted at an output angle larger than the incident angle. Therefore, a part of the light may be reflected on the side surface of the back surface covering layer 15 and its traveling direction may be reversed downward. However, when there is no back surface covering layer 15, the part of the light proceeds laterally and approximately parallel to the back surface of the sapphire substrate 11, so that it does not substantially contribute to the light extraction efficiency. However, if the part of the light is refracted on the side surface of the back surface covering layer 15 and is emitted into the back surface covering layer 15, its traveling direction becomes more upward. If reflection on the side surface of the back surface covering layer 15 is repeated within the back surface covering layer 15, the traveling direction of the light becomes more upward. Thus, the light is not totally reflected on the upper surface of the back surface covering layer 15, partially passes through the interface between the upper surface of the back surface covering layer 15 and the sealing resin 40, and is emitted to the side of the sealing resin 40.

In view of the above brief geometrical optical consideration, it can be found that the light extraction efficiency is improved by providing the back surface covering layer 15 having the apertures 16 with a forward tapered cross-sectional shape on the back surface of the sapphire substrate 11. Also in the case where $ZrO_2$ is used as inorganic compounds which compose the back surface covering layer 15, instead of $HfO_2$, the light extraction efficiency can be improved similarly.

In the case where $SiO_2$ is used as inorganic compounds which compose the back surface covering layer 15, instead of $HfO_2$, since the refractive index of $SiO_2$ is lower than that of the sapphire substrate 11, although total reflection occurs on the interface between the back surface of the sapphire substrate 11 and the back surface covering layer 15, since the refractive index of $SiO_2$ is greater than that of the sealing resin 40, the critical angle on the interface with the back surface covering layer 15 is larger than that on the interface with the sealing resin 40 at the apertures 16. Thus, compared to the case where the back surface covering layer 15 is not provided, the ratio of the light, which is not totally reflected and partially passes through the back surface of the sapphire substrate 11, is improved. In addition, as for the reflection and refraction of the light on the side surface of the back surface covering layer 15, the magnitude relationship of the refraction indexes between the back surface covering layer 15 and the sealing resin 40 inside the apertures 16 is similar to that in the case where the back surface covering layer 15 is formed of $HfO_2$. Therefore, the improvement in light extraction efficiency due to the fact that the side surface of the back surface covering layer 15 is a reverse tapered shape can also be obtained similarly to the case where the back surface covering layer 15 is formed of $HfO_2$, though there is a difference in degree.

[Manufacturing Method of the Present Light Emitting Element]

Hereinafter, a method for manufacturing the present light emitting element will be described. As described above, the present light emitting element 10 is characterized in that the back surface covering layer 15 is provided on the back surface of the sapphire substrate 11, and is particularly characterized by the cross-sectional shape of the apertures 16 provided in the back surface covering layer 15. Therefore, detailed descriptions regarding the semiconductor laminated portion 12, the n electrode 13, and the p electrode 14 formed on the front surface of the sapphire substrate 11 are omitted because they are not the main idea of the present application, various modifications can be found as a specific element structure, and they can be manufactured by conventional methods. A description will be given regarding the method for manufacturing the back surface covering layer 15 formed on the back surface of the sapphire substrate 11 and the apertures 16 with reference to FIG. 9.

First, the semiconductor laminated portion 12, the n electrode 13, the p electrode 14, a protective layer and so on are formed above the front surface of a wafer of the sapphire substrate 11 through well-known manufacturing processes of a nitride semiconductor (Step A1). A wafer whose back surface has been polished is used as the wafer of the sapphire substrate 11.

Then, a performance test such as a testing for electrical characteristics in a wafer stage is performed to each of the present light emitting elements 10 which are formed on the front surface of the wafer of the sapphire substrate 11 in a matrix form (Step A2). In addition, after Step A2, the front surface side of the wafer is covered by vaseline or the like in order to temporarily protect the present light emitting elements 10 formed on the front surface of the wafer of the sapphire substrate 11 from the chemical processing to be performed in Step A3 or later.

Figure 9A:
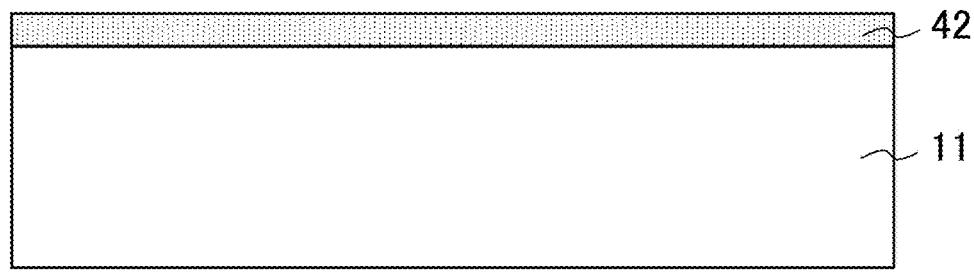
FIGS. 9A to 9D are process sectional views schematically showing one example of the method for manufacturing a back surface covering layer and its apertures in the nitride semiconductor ultraviolet light emitting element of the present invention.

Then, as shown in FIG. 9A, a positive type photoresist 42 is applied onto the back surface of the wafer of the sapphire substrate 11 (Step A3). The film thickness of the photoresist 42 is thicker than that of the back surface covering layer 15 to be formed later.

Figure 9B:
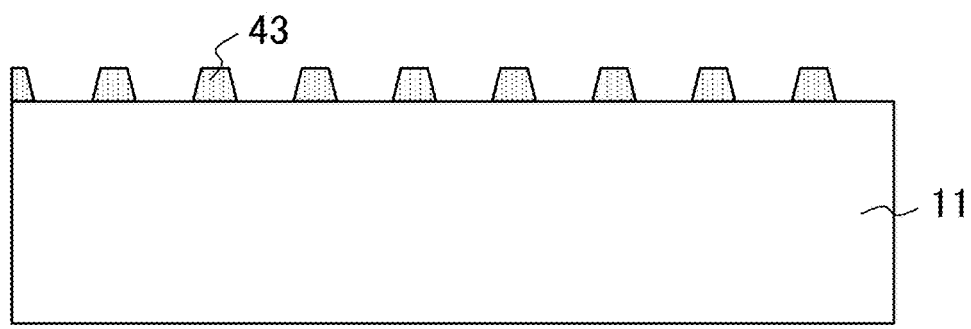

Then, exposure is performed to the photoresist 42 other than the regions to be apertures 16 using a photoresist mask whose pattern is identical to that of the apertures 16, and as shown in FIG. 9B, the exposed part of the photoresist is removed by a development process (Step A4). At the time of exposure in Step A4, exposure conditions (strength, wavelength, etc.) are adjusted so that the side wall surface of the photoresist 43 after the development process has a forward tapered portion which spreads downward. In addition, the photoresist 43 is also formed in a scribing region which will serve as a cutting margin when the wafer after the back surface covering layer 15 has been formed is divided into individual bare chips of the present light emitting elements 10.

Figure 9C:
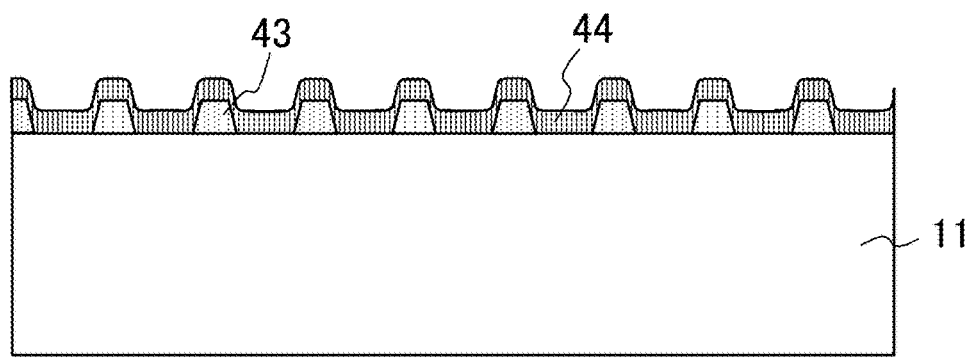

Then, as shown in FIG. 9C, an HfO$_2$ film 44 which will serve as the back surface covering layer 15 is formed on the photoresist 43 after the development process and the back surface of the wafer of the sapphire substrate 11 by an electron-beam evaporation method or a sputtering method, for example (Step A5). If a part around the upper end of the side wall surface of the photoresist 43 also has a forward tapered shape, an HfO$_2$ film 44 deposited on the photoresist 43 is connected to an HfO$_2$ film 44 deposited on the back surface of the wafer of the sapphire substrate 11 through an HfO$_2$ film 44 deposited around the upper end of the side wall surface.

Figure 9D:
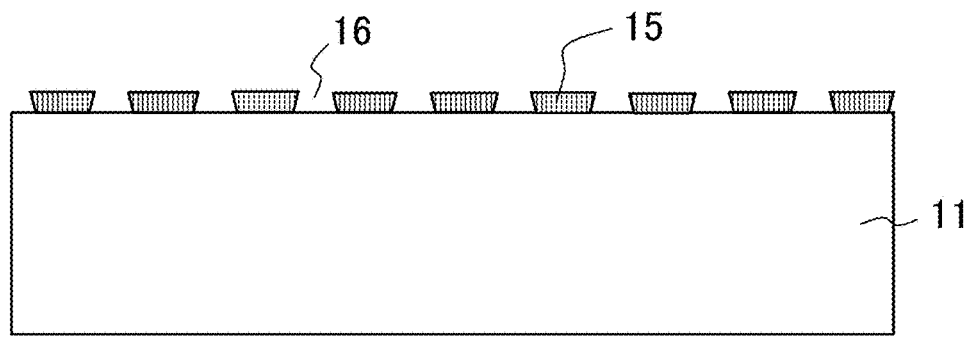

Then, as shown in FIG. 9D, the photoresist 43 is dissolved with an organic solvent such as acetone, and the photoresist 43 and the HfO$_2$ film 44 deposited on the upper surface of the photoresist 43 are removed by a well-known lift-off method (Step A6). In Step A6, since the film thickness of the HfO$_2$ film 44 deposited around the upper end of the side wall surface of the photoresist 43 is thinner than the film thickness of the HfO$_2$ film 44 deposited on the photoresist 43 and the back surface of the wafer of the sapphire substrate 11, the HfO$_2$ film deposited around the upper end of the side wall surface is broken by ultrasonic vibration and the like, and the above dissolving process is then performed. The organic solvent enters from the gap which was formed by breaking the HfO$_2$ film 44 at the upper end of the side wall surface of the photoresist 43 and dissolves the photoresist 43. As a result, the HfO$_2$ film 44 deposited on the back surface of the wafer of the sapphire substrate 11 remains as the back surface covering layer 15. The place from which the HfO$_2$ film 44 has been removed serves as the apertures 16. The apertures 16 are also formed in the scribing region. A cross-sectional shape of the apertures 16 vertical to the back surface of the wafer is identical to the cross-sectional shape of the photoresist 43 except for its upper end after the development process.

Figure 10:
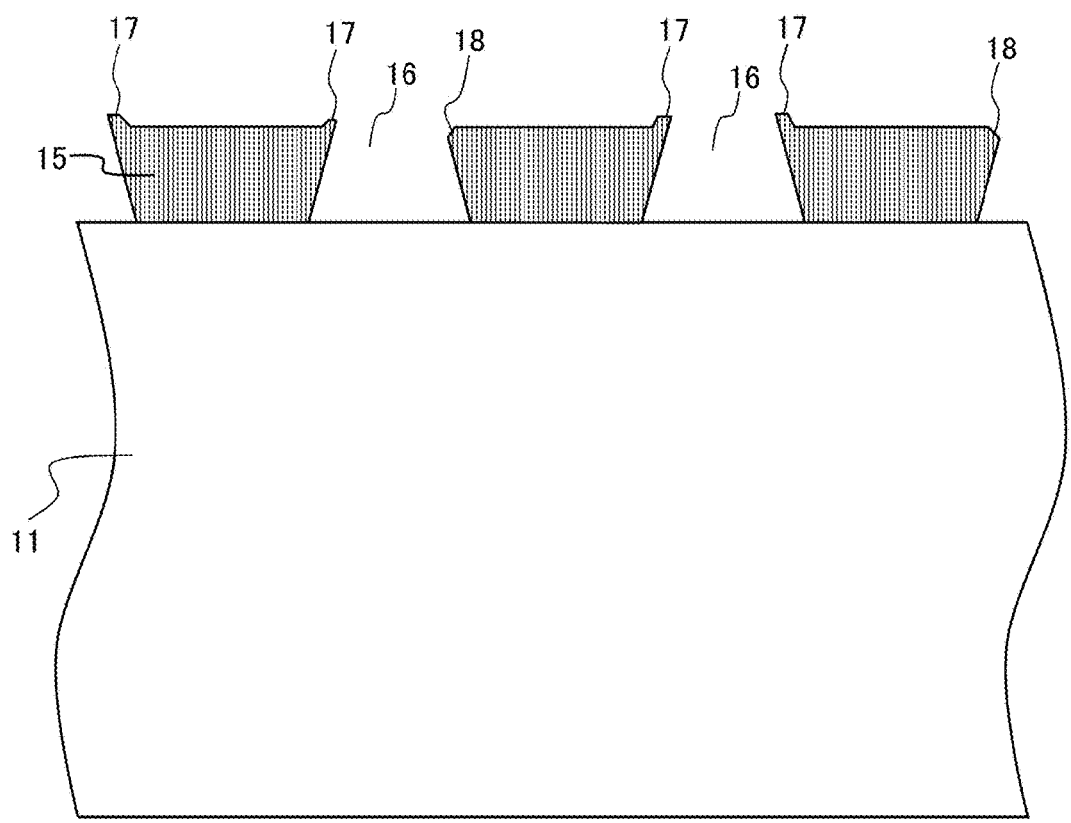
FIG. 10 is a cross-sectional view schematically showing a variation of the back surface covering layer and its apertures.

In addition, the fractions of the HfO$_2$ film 44 which remain in and around the apertures 16 are removed by ultrasonic cleaning or the like, if required. In the above Step A6, since the HfO$_2$ film 44 deposited around the upper end of the side wall surface of the photoresist 43 is broken, as schematically shown in FIG. 10, it is likely that, at the periphery of the apertures 16 on the upper surface of the back surface covering layer 15, a protruding part 17 in which the HfO$_2$ film 44 deposited around the upper end partially remains and a missing part 18 in which the HfO$_2$ film 44 around the periphery partially lacks are generated. However, there is no problem even if the protruding part 17 and the missing part 18 exist at the periphery of the apertures 16 on the upper surface of the back surface covering layer 15 and they are left as they are. In addition, the protruding part 17 may be removed and the upper surface of the back surface covering layer 15 may be flattened by a well-known polishing method such as a chemical mechanical polishing method (CMP).

Then, the material such as vaseline covering the front surface of the wafer of the sapphire substrate 11 is removed, and the wafer after the back surface covering layer 15 has been formed is cut or split along with the scribing region by a well-known dicing technique, so that the present light emitting element in a chip state is obtained (Step A7).

[Manufacturing Method of the Present Light Emitting Device]

Hereinafter, a method for manufacturing the present light emitting device will be described.

First, a bare chip of the diced present light emitting element 10 is fixed on the first and second metal electrode wirings 32 and 33 of the submount 30 by a well-known flip-chip mounting. Specifically, the p electrode 14 is physically and electrically connected to the first metal electrode wiring 32 through gold bumps etc., and the n electrode 13 is physically and electrically connected to the second metal electrode wiring 33 through gold bumps etc. (Step B1).

Then, a coating solution obtained by dissolving a non-bonding amorphous fluororesin in a fluorine-containing solvent, preferably an aprotic fluorine-containing solvent, is injected onto a submount 30 and the present light emitting element 10 using a Teflon needle or the like having good releasability. Thereafter, the coating solution is gradually heated to volatize the solvent, so that a sealing resin 40 of a non-bonding amorphous fluororesin is formed on the upper surface (the upper surface of the back surface covering layer 15 and the opening surfaces of the apertures 16) and the side wall surface of the present light emitting element 10, on the upper surface of the submount 30 (the upper surface and side wall surface of the first and second metal electrode wirings 32 and 33, and the surface of the base material 31 exposed between the first and second metal electrode wirings 32 and 33), in the gap between the submount 30 and the present light emitting element 10, and at the inside of the apertures 16 (Step B2). In addition, regarding the evaporation of the solvent in Step B2, in order not to leave any air bubbles in the sealing resin 40, the solvent is heated and evaporated by gradually increasing the temperature from a low temperature range (such as around room temperature) lower than a boiling point of the solvent to a high temperature range (such as around 200° C.) higher than the boiling point of the solvent.

Then, the sealing resin 40 is heated and softened within a temperature range lower than the temperature (around 350° C.) at which a non-bonding amorphous fluororesin starts to decompose, for example, within a temperature range from 150° C. to 300° C., more preferably, from 200° C. to 300° C., and the sealing resin 40 on the upper surface of the present light emitting element 10 is pressed toward the present light emitting element 10 (Step B3). This allows the sealing resin 40 to be tightly filled in the apertures 16 in a compressed state. As a result, the sealing resin filled in the apertures 16 becomes harder to be released partly because of the cross-sectional shape of the apertures 16 of which the openings are narrower upward, so that the filled sealing resin surely functions as an anchor.

Then, a lens 41 made of the same non-bonding amorphous fluororesin as the sealing resin 40 is formed on the sealing resin 40 so as to cover the present light emitting element 10 by, for example, injection molding, transfer molding, compression molding and so on (Step B4). As for a mold for each molding, a metal mold, a silicon resin mold, and a combination thereof can be used.

In addition, the heat process and the press process in Step B3 may be performed at the same time when the lens 41 is formed in Step B4. Alternatively, only the heat process may be performed in Step B3, and the press process may be performed at the time of forming the lens 41 in Step B4.

Other Embodiments

Hereinafter, variations of the above embodiment will be described.

<1> In the above embodiment, as an aspect in which the present light emitting element 10 is flip-chip mounted on the submount 30, the case where the p electrode 14 is connected to the first metal electrode wiring 32 through gold bumps and the n electrode 13 is connected to the second metal electrode wiring 33 through gold bumps has been described. However, in the case where the p electrode 14 and the n electrode 13 are formed with a uniform height so that their upper surfaces become a plane surface, the p electrode 14 and the n electrode 13 may be physically and electrically connected to the first metal electrode wiring 32 and the second metal electrode wiring 33 through a solder material (corresponding to bonding materials) by a well-known soldering method such as a reflow method, respectively. In addition, as for the method of aligning the heights of the p electrode 14 and the n electrode 13 so that their upper surfaces become a plane surface, for example, a p-side plated electrode is formed so as to be electrically connected to the p electrode 14 and cover the upper and side surfaces of the mesa portion through an insulating protective film, and an n-side plated electrode is formed away from the p-side plated electrode so as to be electrically connected to the n electrode 13 and have the same height as the p-side plated electrode by a electrolytic plating method or the like. Regarding the details for the plated electrodes, see the description of the international application No. PCT/JP2015/060588.

<2> According to the above embodiment, the description has been given as to the present light emitting device 1 in which one present light emitting element 10 is mounted on the submount 30, but the present light emitting device 1 may be configured such that a plurality of the present light emitting elements 10 are mounted on the submount or the base such as a printed substrate. In this case, the plurality of the present light emitting elements 10 may be collectively sealed or may be individually sealed with the sealing resin 40. In this case, a resin dam is formed on the surface of the base to surround the one or more present light emitting elements 10 which is a unit to be sealed, and the sealing resin 40 is formed in the region surrounded by the resin dam in the manner described in the above embodiment, for example. Furthermore, the base to be used for the present light emitting element 10 is not limited to the submount or the printed substrate.

Also, in the case where one present light emitting element 10 is mounted on the submount 30, the present light emitting device 1 may be manufactured as follows. The first and second metal electrode wirings 32 and 33 of a plurality of the submounts 30 are formed on the front surface side of one base material 31, and the lead terminals 34 and 35 of the plurality of the submounts 30 are formed on the back surface side of the one base material 31. A plurality of the present light emitting elements 10 are respectively mounted by flip-chip mounting on the submounts 30 on a submount plate in which the plurality of the submounts 30 are arranged in a matrix form. After the sealing resin 40 is formed or the sealing resin 40 and the lens 41 are formed with respect to each of the present light emitting elements 10, the submount plate is divided into the individual submounts 30, so that the one present light emitting element 10 is mounted on the submount 30.

<3> In the above embodiment, although the case where the back surface covering layer 15 is formed of a single layer of $HfO_2$ is assumed, the back surface covering layer 15 may be formed of two layers of $HfO_2$ and $SiO_2$. As an example, the back surface covering layer 15 may be a two layer structure in which the lower layer is an $HfO_2$ layer and the upper layer is an $SiO_2$ layer. In this case, in Step A5 of the method for manufacturing the back surface covering layer 15 and the apertures 16, $HfO_2$ and $SiO_2$ are sequentially formed by an electron-beam evaporation method, a sputtering method or a chemical vapor deposition (CVD) method, and the $HfO_2$ film and the $SiO_2$ film deposited on the upper surface of the photoresist 43 are removed at once by a lift-off method in Step A6.

Furthermore, as another example, after the back surface covering layer 15 is formed of a single layer of $HfO_2$, the upper and side surfaces of the back surface covering layer 15 and the back surface of the sapphire substrate 11 exposed at the bottom of the apertures 16 may be covered by an $SiO_2$ film.

<4> In the above embodiment, in Step A6 of the method for manufacturing the back surface covering layer 15 and the apertures 16, although the $HfO_2$ film 44 deposited around the upper end of the side wall surface of the photoresist 43 is broken by ultrasonic vibration or the like, instead of this, or in addition to this, exposure conditions (strength, wavelength, etc.) may be gradually or continuously adjusted so that the part around the upper end of the side wall surface of the photoresist 43 have a reverse tapered shape or an overhang shape, and the $HfO_2$ film 44 deposited on the upper surface of the photoresist 43 and the $HfO_2$ film 44 deposited on the back surface of the wafer of the sapphire substrate 11 may be separated from each other around the upper end of the side wall surface of the photoresist 43. In this case, the organic solvent enters from the gap in which the $HfO_2$ films 44 are separated at the upper end of the side wall surface of the photoresist 43, and dissolves the photoresist 43.

Furthermore, although a positive type photoresist 42 is used in Step A3 of the method for manufacturing the back surface covering layer 15 and the apertures 16, a negative type photoresist may be used. However, in Step A4, a photomask having a reverse pattern of the apertures 16 is used, exposure is performed on the photoresist 42 in a region to be the apertures 16, and the photoresist other than the exposed portion is removed by a development process.

<5> In the above embodiment, although the $HfO_2$ film 44 formed in Step A5 is patterned by the well-known lift-off method in Step A6 of the method for manufacturing the back surface covering layer 15 and the apertures 16, the $HfO_2$ film 44 deposited on the upper surface of the photoresist 43 may be polished and removed by a well-known polishing method such as a chemical mechanical polishing method (CMP), instead of the lift-off method, to leave only the $HfO_2$ film 44 deposited on the back surface of the wafer of the sapphire substrate 11, and after that, the exposed photoresist 43 may be dissolved and removed with the organic solvent such as acetone.

<6> In the above embodiment, although the photoresist 43 is used as a resist layer to be used for the lift-off method in Step A6 in the method for manufacturing the back surface covering layer 15 and the apertures 16, the resist layer may be not a photoresist material but a material for which wet etching can be performed, and the cross-sectional shape may be processed and patterned into a forward tapered shape by the wet etching.

<7> In the above embodiment, although the sealing resin 40 formed in Step B2 is further heated and pressed in Step B3 of the method for manufacturing the present light emitting device, if the sealing resin 40 is sufficiently filled in the apertures 16 in Step B2, the above processes may be omitted. In addition, either the heat process or the press process but not both may be performed in Step B3.

<8> In the above embodiment, although the lens 41 made of the same non-bonding amorphous fluororesin as the sealing resin 40 is formed on the sealing resin 40 in Step B4 of the method for manufacturing the present light emitting device, another resin part may be formed in Step B4 without forming the lens 41. For example, instead of using the submount 30 exemplified in FIG. 6 as a base for flip-chip mounting in Step B1, in the case where a side wall, which is higher than the upper surface of the present light emitting element 10 after flip-chip mounting and surrounds the present light emitting element 10, is provided in the outer peripheral region of the base material 31, Step B4 may include injecting a non-bonding amorphous fluororesin in a solid state into a space surrounded by the side wall above the sealing resin 40 formed in Step B2, melting the non-bonding amorphous fluororesin at a high temperature of 250° C. to 300° C., and after that, gradually cooling it to form a second sealing resin film. In addition, the lens 41 may be formed on the second sealing resin film, if required.

INDUSTRIAL APPLICABILITY

The nitride semiconductor ultraviolet light emitting device of the present invention can be applied to a back surface emission type light emitting diode having a center emission wavelength of about 350 nm or less.

DESCRIPTION OF SYMBOLS

1: Nitride semiconductor ultraviolet light emitting device
10: Nitride semiconductor ultraviolet light emitting element
11: Sapphire substrate
12: Semiconductor laminated portion
13: n electrode
14: p electrode
15: Back surface covering layer
16: Aperture
17: Protruding part
18: Missing part
20: AlN layer
21: AlGaN layer
22: n-type clad layer (n-type AlGaN)
23: Active layer
24: Electron blocking layer (p-type AlGaN)
25: p-type clad layer (p-type AlGaN)
26: p contact layer (p-type GaN)
30: Submount
31: Base material
32: First metal electrode wiring
320: First electrode pad
321: First wiring portion
33: Second metal electrode wiring
330: Second electrode pad
331: Second wiring portion
34, 35: Lead terminal
40: Sealing resin
41: Lens

The invention claimed is:

1. A nitride semiconductor ultraviolet light emitting device in which a nitride semiconductor ultraviolet light emitting element is mounted by flip-chip mounting on a base for flip-chip mounting, the nitride semiconductor ultraviolet light emitting element comprising:
a sapphire substrate;
a plurality of AlGaN-based semiconductor layers laminated on a front surface of the sapphire substrate;
an n electrode formed of one or more metal layers in contact with the plurality of AlGaN-based semiconductor layers;
a p electrode formed of one or more metal layers in contact with the plurality of AlGaN-based semiconductor layers; and
a back surface covering layer formed of an inorganic compound that is formed on a back surface of the sapphire substrate and transmits ultraviolet light, wherein
the back surface covering layer has apertures through which a part of the back surface of the sapphire substrate is exposed,
the apertures are uniformly dispersed or distributed on the back surface of the sapphire substrate,
a cross-sectional shape of each of the apertures vertical to the back surface of the sapphire substrate has a portion where an aperture width of a part close to the back surface is wider than an aperture width of a part far from the back surface,
the nitride semiconductor ultraviolet light emitting element is sealed with an amorphous fluororesin whose terminal functional group is perfluoroalkyl group, and
the amorphous fluororesin covers a front surface of the back surface covering layer and fills insides of the apertures.

2. The nitride semiconductor ultraviolet light emitting device according to claim 1, wherein
the back surface covering layer is a single-layer formed of any one of $HfO_2$, $ZrO_2$ and $SiO_2$, or a laminated body formed of at least any two of $HfO_2$, $ZrO_2$ and $SiO_2$.

3. The nitride semiconductor ultraviolet light emitting device according to claim 1, wherein
a refractive index of the back surface covering layer is greater than that of the sapphire substrate.

4. The nitride semiconductor ultraviolet light emitting device according to claim 1, wherein
a planarly-viewed shape of the apertures is any one of dot, stripe, lattice, concentric circle, concentric annular shape and spiral.

5. The nitride semiconductor ultraviolet light emitting device according to claim 1, wherein
a structural unit of polymer or copolymer that forms the amorphous fluororesin has a fluorine-containing aliphatic cyclic structure.

6. A method of manufacturing the nitride semiconductor ultraviolet light emitting device according to claim 1, wherein
a process of manufacturing the nitride semiconductor ultraviolet light emitting element comprises steps of:
after forming a plurality of AlGaN-based semiconductor layers, forming an n electrode formed of one or more metal layers in contact with the plurality of AlGaN-based semiconductor layers and a p electrode formed of one or more metal layers in contact with the plurality of AlGaN-based semiconductor layers above a front surface of a sapphire substrate,
forming a resist layer on a back surface of the sapphire substrate, and then patterning the resist layer so that the resist layer becomes a predetermined planarly-viewed shape and its cross-sectional shape vertical to the back surface of the sapphire substrate has a portion where a width of a part close to the back surface is wider than a width of a part far from the back surface;
depositing a back surface covering layer which transmits ultraviolet light on the patterned resist layer and the back surface of the sapphire substrate which is not covered by the resist layer; and
patterning the back surface covering layer by removing the patterned resist layer and the back surface covering layer deposited on the resist layer.

7. The method of manufacturing the nitride semiconductor ultraviolet light emitting device according to claim 6, wherein the resist layer is a photoresist, and the step of patterning the resist layer comprises: after forming the photoresist on the back surface of the sapphire substrate, patterning the photoresist by performing exposure and development processes so that the photoresist becomes a predetermined planarly-viewed shape and its cross-sectional shape vertical to the back surface of the sapphire substrate has a portion where a width of a part close to the back surface is wider than a width of a part far from the back surface.

8. The method of manufacturing the nitride semiconductor ultraviolet light emitting device according to claim 6 comprising steps of:

mounting the nitride semiconductor ultraviolet light emitting element by flip-chip mounting on the base by electrically and physically connecting the p electrode and the n electrode of the nitride semiconductor ultraviolet light emitting element to electrode pads formed on the base corresponding to the p electrode and the n electrode, respectively, through a boding material; and covering a mount surface of the base on which the nitride semiconductor ultraviolet light emitting element is mounted, side walls of the nitride semiconductor ultraviolet light emitting element and a front surface of the back surface covering layer with the amorphous fluororesin, and filling a gap between the mount surface of the base and the nitride semiconductor ultraviolet light emitting element and insides of the apertures of the back surface covering layer with the amorphous fluororesin.

9. A method of manufacturing the nitride semiconductor ultraviolet light emitting device according to claim 1 comprising steps of:

mounting the nitride semiconductor ultraviolet light emitting element by flip-chip mounting on the base by electrically and physically connecting the p electrode and the n electrode of the nitride semiconductor ultraviolet light emitting element to electrode pads formed on the base corresponding to the p electrode and the n electrode, respectively, through a boding material; and forming a resin layer of the amorphous fluororesin which covers a mount surface of the base on which the nitride semiconductor ultraviolet light emitting element is mounted, side walls of the nitride semiconductor ultraviolet light emitting element, a front surface of the back surface covering layer and opening surfaces of the apertures, and fills a gap between the mount surface of the base and the nitride semiconductor ultraviolet light emitting element and insides of the apertures of the back surface covering layer.

10. A method of manufacturing the nitride semiconductor ultraviolet light emitting device according to claim 9 comprising a step of:

after the step of forming the resin layer, heating and softening the resin layer at a temperature within a range of 150° C. or more and 300° C. or less.

11. The method of manufacturing the nitride semiconductor ultraviolet light emitting device according to claim 9 comprising a step of:

after the step of forming the resin layer, pressing the resin layer toward the nitride semiconductor ultraviolet light emitting element, the resin layer covering the front surface of the back surface covering layer and the opening surfaces of the apertures and filling the insides of the apertures.

* * * * *